(12) United States Patent
Iwase et al.

(10) Patent No.: US 7,309,945 B2
(45) Date of Patent: Dec. 18, 2007

(54) LAMINATED-TYPE PIEZOELECTRIC ELEMENT AND A MANUFACTURING METHOD THEREOF

(75) Inventors: Akio Iwase, Nishio (JP); Tetsuji Ito, Kariya (JP); Toshio Ooshima, Oobu (JP); Shige Kadotani, Chita-gun (JP)

(73) Assignee: Denso Corporation, Kariya, Aichi-pref. (JP)

( * ) Notice: Subject to any disclaimer, the term of this patent is extended or adjusted under 35 U.S.C. 154(b) by 362 days.

(21) Appl. No.: 11/046,699

(22) Filed: Feb. 1, 2005

(65) Prior Publication Data

US 2005/0168106 A1    Aug. 4, 2005

(30) Foreign Application Priority Data

Feb. 3, 2004  (JP)  .............................. 2004-027162

(51) Int. Cl.
*H01L 41/04* (2006.01)
*H01L 41/047* (2006.01)
(52) U.S. Cl. .................. 310/328; 310/364; 310/365
(58) Field of Classification Search ................ 310/328, 310/363–366
See application file for complete search history.

(56) References Cited

U.S. PATENT DOCUMENTS

| | | | | |
|---|---|---|---|---|
| 5,175,465 A | * | 12/1992 | Um et al. | .................... 310/328 |
| 5,245,734 A | * | 9/1993 | Issartel | ........................ 310/328 |
| 5,254,212 A | * | 10/1993 | Someji et al. | ............... 310/366 |
| 6,414,417 B1 | * | 7/2002 | Tsuyoshi et al. | ............ 310/366 |
| 6,465,082 B1 | * | 10/2002 | Takezawa et al. | .......... 428/209 |
| 7,217,992 B2 | * | 5/2007 | Ogino et al. | ................. 257/678 |
| 7,225,514 B2 | * | 6/2007 | Iwase et al. | ................. 310/328 |
| 2003/0085494 A1 | | 5/2003 | Iwase et al. | ................. 264/614 |

FOREIGN PATENT DOCUMENTS

| | | | |
|---|---|---|---|
| JP | 8-274381 | | 10/1996 |
| JP | 2001144340 A | * | 5/2001 |
| JP | 2001156348 A | * | 6/2001 |
| JP | 2001-267646 | | 9/2001 |
| JP | 2001267646 A | * | 9/2001 |
| JP | 2003-205511 | | 7/2003 |
| JP | 2005223013 A | * | 8/2005 |

* cited by examiner

*Primary Examiner*—J. San Martin
*Assistant Examiner*—J. Aguirrechea
(74) *Attorney, Agent, or Firm*—Nixon & Vanderhye P.C.

(57) ABSTRACT

The invention provides a laminate-type piezoelectric element comprising a ceramic laminate 10 with ceramic layers 11 and internal electrode layers 12 respectively stacked alternately, and a pair of external electrodes respectively connecting with a pair of connecting areas 15 formed at an outer peripheral area of the ceramic laminate 10. The internal electrode layer comprises an internal electrode part 120 with electric conductivity, and a non-pole part 120 where the internal electrode part 120 does not exist at the inside near an outer peripheral area. The ceramic laminate 10 comprises stress relaxation parts 13 able to modify more easily their shapes than the ceramic layers 11, along at least a part of said internal electrode layers. This stress relaxation part 13 is placed so as to overlap with the non-pole part 129 of either of the internal electrode layers 12, in a stacking direction of the ceramic laminate 10.

10 Claims, 19 Drawing Sheets

LAMINATED-TYPE PIEZOELECTRIC ELEMENT AND A MANUFACTURING METHOD THEREOF

BACKGROUND OF THE INVENTION

1. Field of the Invention

The present invention relates to a laminate-type piezoelectric element with a high durability, obtained by stacking ceramic layers and internal electrode layers, and a method of manufacturing the element.

2. Description of the Related Art

In the past, for example, there was a laminate-type piezoelectric element using a ceramic laminate with a partial electrode structure, wherein an outer peripheral part of each of internal electrode parts forming the internal electrodes layer is not exposed at a connecting area for connecting the external electrode (e.g. Japanese unexamined patent publication No. 2003-205511).

Further, in order to improve the reliability of electrical insulation at an outer peripheral area of the ceramic laminate, for example, there is a laminate-type piezoelectric element in which the outer peripheral part of the internal electrode part is not exposed at the outer peripheral area except for said connecting area in said ceramic laminate.

However, there is the following problem in said current laminate-type piezoelectric element. More specifically, there is a problem that stress, according to a piezoelectric displacement of said laminate-type piezoelectric element, concentrates at non-pole parts, wherein said internal electrode parts do not exist at the inside near outer peripheral parts, and displacement due to a piezoelectric effect does not occur.

On that account, there have been cases where cracks, etc. were caused between layers of said ceramic laminate, due to concentration of the stress, when the laminate-type piezoelectric element was used for a long period.

Therefore, it was not easy to obtain both of high performance and high durability in current laminate-type piezoelectric element.

SUMMARY OF THE INVENTION

The present invention was achieved by considering said current problem, and provides a laminate-type piezoelectric element with high durability and a little possibility of causing problems such as cracks over a long term.

The first invention is a laminate-type piezoelectric element comprising a ceramic laminate with ceramic layers and internal electrode layers respectively stacked alternately, and a pair of external electrodes respectively connecting with a pair of connecting areas formed at an outer peripheral area of the ceramic laminate, wherein each of said internal electrode layers comprises an internal electrode part with electric conductivity, and a non-pole part where the internal electrode part does not exist at the inside near an outer peripheral area of said ceramic laminate, said ceramic laminate comprises stress relaxation parts, wherein each of the stress relaxation parts, being able to modify more easily its own shape than said ceramic layer, is adjacent to at least a part of said internal electrode layer in a direction of stacking said ceramic layers, each of said stress relaxation parts is located to overlap with said non-pole parts of either of said internal electrode layers in the stacking direction.

In said ceramic laminate forming the laminate-type piezoelectric element of the first invention, the stress relaxation parts are formed so as to respectively overlap with the non-pole parts in a direction of stacking the ceramic layers.

As the stress relaxation parts can, as described above, more easily modify their shape than said ceramic layers, these stress relaxation parts can absorb at least a part of the strain due to a piezoelectric displacement of the laminate-type piezoelectric element.

On that account, the stress due to the strain being caused according to the piezoelectric displacement is decreased at the non-pole parts overlapping in the stacking direction with these stress relaxation parts. Therefore, in the ceramic laminate, the possibility of cracks between layers of the ceramic laminate due to too large a stress acting on the non-pole parts can be restrained.

Consequently, the laminate-type piezoelectric element of the first invention has excellent qualities with high durability and less possibility of cracks between layers of the ceramic laminate even over a long term, while taking an advantage of high electric reliability accompanied with the ceramic laminate having the non-pole parts.

In other words, the laminate-type piezoelectric element with a high performance and a large amount of piezoelectric displacement can be obtained, by using the ceramic laminate with less possibility of causing cracks between layers.

As described above, the laminate-type piezoelectric element of the first invention has a high performance and good qualities with durability, wherein troubles of the ceramic laminate are restrained.

The second invention is a method for manufacturing of a laminate-type piezoelectric element, which comprises a ceramic laminate with ceramic layers and internal electrode layers respectively stacked alternately, and a pair of external electrodes respectively connecting with a pair of connecting areas formed at an outer peripheral area of the ceramic laminate, wherein said ceramic laminate comprises said ceramic layers composed of internal electrode parts with electric conductivity and non-pole parts where the internal electrode parts do not exist at the inside near an outer peripheral area of said ceramic laminate, and forms stress relaxation parts being able to modify their own shape more easily than said ceramic layers, by being respectively adjacent to at least parts of said internal electrode layers in a direction of stacking said ceramic layers so as to respectively overlap with said non-pole parts in the stacking direction, comprising in order to form said ceramic laminate, a green sheet forming step to form a green sheet composed of ceramic material for cutting out a sheet piece to be stacked as an intermediate laminate prior to calcining, an electrode placing step to place electrode material for forming said internal electrode parts, by not existing at the inside near an outer edge of a cut-out area so as to form said non-pole parts, at the cut-out area for obtaining the sheet piece in said green sheet, a stress relaxation material placing step to place stress relaxation material comprising vanishing material to vanish by calcining on at least parts of outer peripheral parts of the cut-out areas, for at least parts of said cut-out areas having been applied the electrode placing step, a cutting-out step to obtain said sheet pieces by cutting out the cut-out areas from the green sheet, a stacking step to form said intermediate laminate by stacking the sheet pieces having been cut out, and a calcining step to obtain said ceramic laminate with said stress relaxation parts formed by having the vanishing material vanish in the stress relaxation material by calcining the intermediate laminate.

In the method for manufacturing of a laminate-type piezoelectric element of the second invention, the stress relaxation material is applied to at least a part of outer peripheral part of the cut-out area at the stress relaxation material placing step.

After that, the stress relaxation part is then formed by vanishing the vanishing material in the stress relaxation material, at the calcining step for calcining the intermediate laminate stacked.

Thus, the stress relaxation part can be efficiently formed, with simultaneous calcining of the intermediate laminate, by using the stress relaxation material comprising at least partly the vanishing material to be vanished by calcining.

Herein, for example, if the stress relaxation material comprising only the vanishing material is used, the stress relaxation part becomes a gap in shape of a slit along the internal electrode layers. If, for example, the vanishing material is comprised as a part in the stress relaxation material, the stress relaxation part can be formed as a porous part with low density having a plurality of pores.

The laminate-type piezoelectric element with excellent qualities of both of durability and performance can be then obtained as in the first invention, by forming the stress relaxation part as a gap or a porous part, and making the stress relaxation part easier to modify than the ceramic layer.

Further, in the ceramic laminate, the stress relaxation part is formed so as to be adjacent to the internal electrode layer in the stacking direction.

Therefore, for preparing the ceramic laminate, for example, it is possible to form each ceramic layer only at one side of one sheet piece, and to place the material, for forming the stress relaxation part by calcining, between two layers of the sheet pieces.

On the other hand, when the stress relaxation part is formed at an intermediate position of the ceramic layer in the stacking direction, it is necessary to form one ceramic layer, for example, from two or more sheet pieces, and to place the material for forming the stress relaxation part between the layers of sheet pieces.

Thus, in said ceramic laminate, it can be achieved to form said each ceramic layer from only said one sheet piece and to make it thin. By utilizing said ceramic laminate of the thin ceramic layers, it becomes possible to restrain a driving electric voltage, and to comprise the laminate-type piezoelectric element with good efficiency.

As a matter of course, for manufacturing the ceramic laminate, the each ceramic layer can be formed also by stacking said plural sheet pieces.

DETAILED DESCRIPTION OF THE INVENTION

Figure 1:
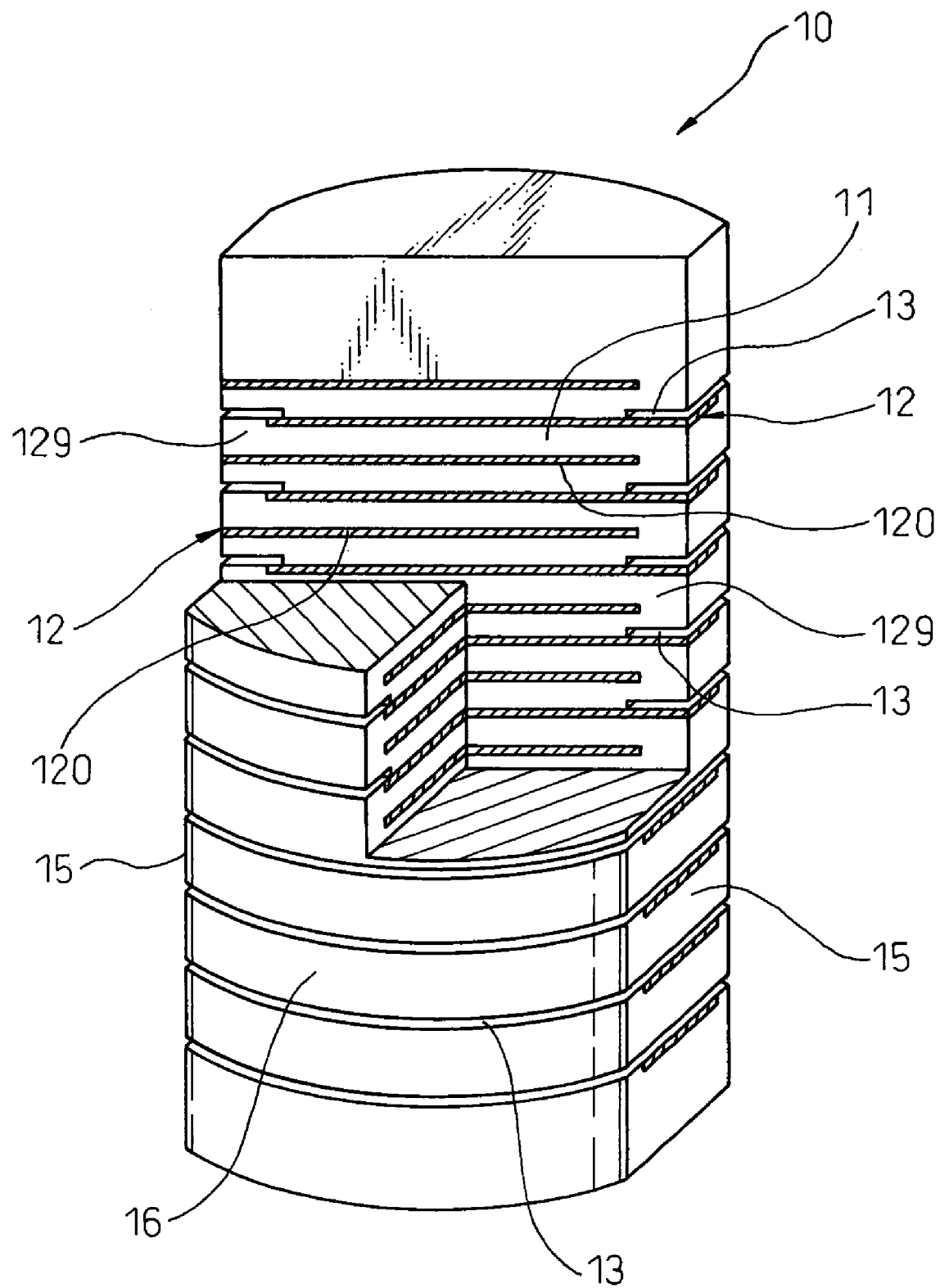
FIG. 1 is a structural drawing to illustrate a stacked structure of a ceramic laminate in Example 1.

In the first invention, it is preferred that said every other internal electrode layer, exposing said internal electrode part at one side of said connecting areas, comprises said non-pole part at the other side of the connecting areas, and said every other internal electrode layer, exposing said internal electrode part at the other side of said connecting areas, comprises said non-pole part at the one side of the connecting areas.

In this case, at the each connecting area, it becomes easy to ensure electric insulation on the connecting area, by forming the non-pole part at the every other internal electrode layer.

At each of connecting areas, it is preferred that each of said stress relaxation parts is formed at a place adjacent to said internal electrode part in the stacking direction, by avoiding a place adjacent to the non-pole part in the stacking direction.

In this case, on the connecting area, said internal electrode part of the internal electrode layer having formed the non-pole part can be sealed in a more closely perfect shape with a ceramic material, and the reliability of electric insulation can be improved.

It is also preferred that each of said stress relaxation parts is formed by facing both of said connecting areas along said internal electrode layer adjacent to the stress relaxation part in the stacking direction. In this case, an amount of the stress acting on the non-pole part formed on the each connecting area can be effectively decreased.

It is also preferred that each of said non-pole parts of the internal electrode layers is formed over the entire range in a peripheral direction of an outer insulation peripheral area, i.e. an outer peripheral area except for each of said connecting areas of the outer peripheral areas of said ceramic laminate, and each of said stress relaxation parts is formed over the entire range in the peripheral direction of the outer insulation peripheral area.

In this case, the electrical insulation on the outer peripheral areas can be easily ensured by the non-pole parts formed on the outer peripheral areas, and a possibility of a too-strong stress acting on the non-pole parts formed on the outer peripheral areas can be restrained by the stress relaxation parts formed on the outer peripheral areas.

It is also preferred that each of said stress relaxation parts is formed adjacent in the stacking direction to all of said internal electrode layers or to every one or more and 12 or less internal electrode layers in the stacking direction.

In this case, stress concentrations at the non-pole parts can be effectively restrained, by placing the stress relaxation parts.

Especially, when the stress relaxation parts are formed along all of internal electrode layers, the stresses acting on the non-pole parts can be most effectively restrained.

Herein, for accurately calcining the intermediate laminate placed with the stress relaxation material, in general, it is necessary to calcine slowly. When calcining slowly, said ceramic laminate with high strength can be formed, while the degree of shape accuracy of the ceramic laminate itself or the stress relaxation part is maintained in the ceramic laminate.

On the other hand, when the stress relaxation parts are placed along every one or more and 12 or less internal electrode layers in the stacking direction, both of the effect of restraining the stress concentrations at the non-pole parts, and the degree of shape accuracy and calcining efficiency of the ceramic laminate can be achieved.

It is also preferred that each of said stress relaxation parts is a gap in shape of a slit. In this case, the stresses acting on the non-pole parts can be most effectively degreased, by making modification of the shape of the stress relaxation part significantly easy.

It is also preferred that each of said stress relaxation parts is a part in shape of a thin layer composed of porous ceramic material. In this case, when the stress relaxation part is formed with the porous ceramic material, the stress relaxation part has high reliability, and becomes what can modify more easily than the ceramic material composed of dense ceramic material.

It is also preferred that each of said stress relaxation parts is a part where insulating material with electrical insulation properties is filled in the gap in shape of a slit. In this case, the electric insulation of the internal electrode layer adjacent to the stress relaxation part in the stacking direction can be improved by the stress relaxation part filled with the insulation material.

It is also preferred that the thickness of said stress relaxation part in the stacking direction is 1 μm or more and 18 μm or less. In this case, the stress relaxation part can be efficiently formed, while fully ensuring the thickness of the ceramic layer.

In the second invention, it is preferred that said stress relaxation material consists of only the vanishing material to be vanished by calcining. In this case, the ceramic laminate can be obtained by calcining, and simultaneously, the stress relaxation part can be efficiently formed as the gap in shape of a slit.

It is also preferred that said stress relaxation material is prepared by dispersing said vanishing material in the ceramic material. In this case, the ceramic laminate can be obtained by calcining, and simultaneously, the stress relaxation porous part with a plurality of pores, made by vanishing the vanishing material, can be efficiently formed.

It is also preferred that said vanishing material is composed of carbon particles in shape of a powder, resin particles in shape of a powder, or carbonized organic particles and the like by carbonizing organic particles in shape of a powder. In a case where the carbon particles are used as the vanishing material, said stress relaxation parts can be formed with the high degree of shape accuracy, because properties of the carbon particles, of which thermal modification of the shape is less, effectively act.

On the other hand, in the case where the carbonized organic particles are used as the vanishing material, costs for manufacturing the stress relaxation parts can be controlled.

For example, particles prepared by pulverizing soybeans or corns, particles prepared by pulverizing resin material, and the like, can be used as said organic particles.

Further, the carbonized organic particles mean particles which were carbonized to a certain extent by removing a part of water contained in the organic particles, and became in shape of micro particles with good fluidity and good dispersion properties.

EXAMPLES

Example 1

This example relates to a laminate-type piezoelectric element 1 comprising stress relaxation parts 13 for relaxation of stress being caused at the time of piezoelectric displacement, and a method for manufacturing thereof. Contents of them are explained below, by using FIGS. 1-13.

Figure 2:
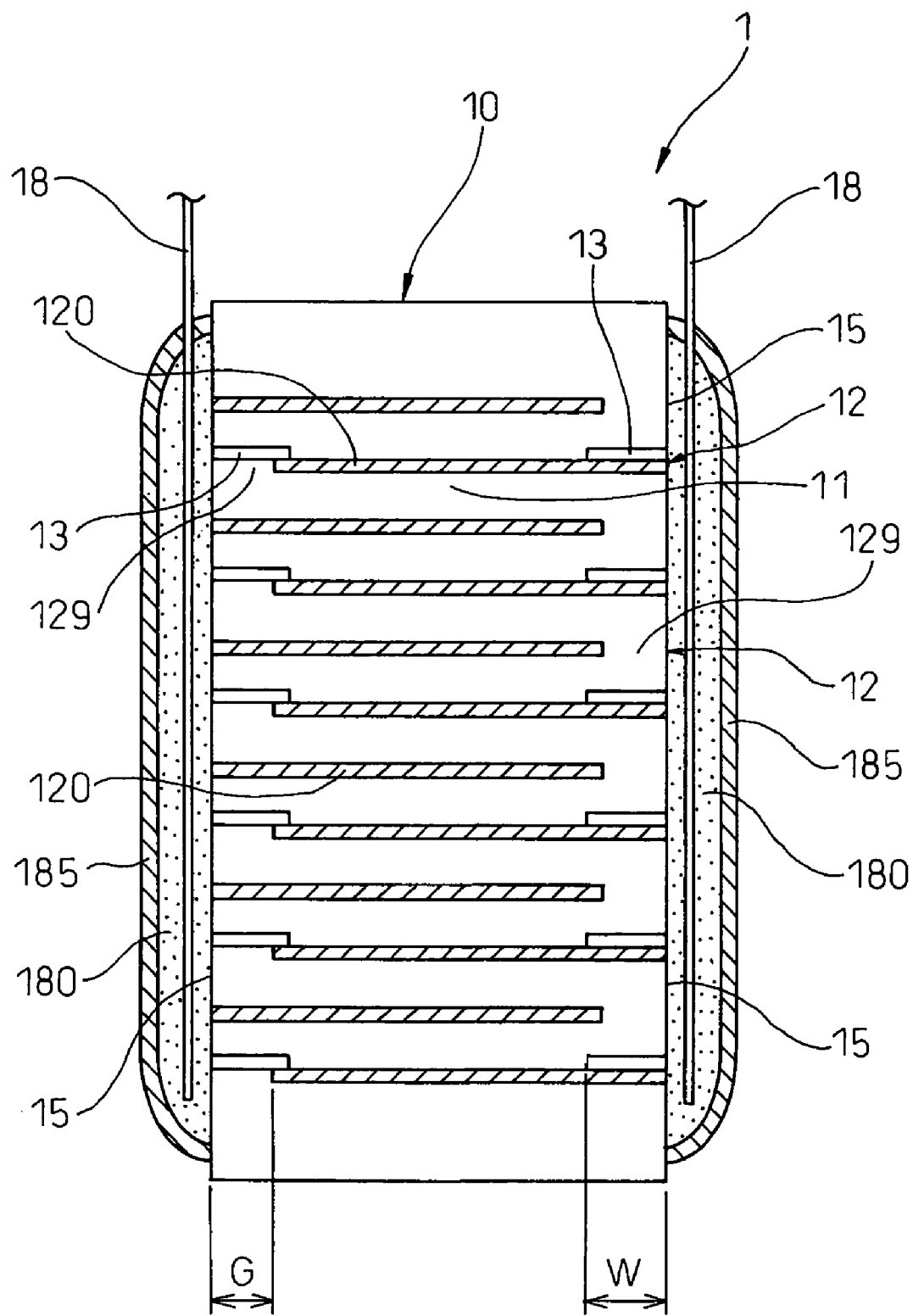
FIG. 2 is a structural drawing to illustrate a sectional structure of a laminate-type piezoelectric element in Example 1.

As shown in FIG. 1 and FIG. 2, the laminate-type piezoelectric element 1 of this Example comprises a ceramic laminate 10 formed by stacking ceramic layers 11 and internal electrode layers 12 in alternate order, and a pair of external electrodes 18 respectively connected with a pair of connecting areas 15 formed on outer peripheral area of the ceramic laminate 10.

Each of said internal electrode layers 12 comprises, as shown in FIG. 1, an internal electrode part 120 with electric conductivity, and a non-pole part 129 where the internal electrode part 120 does not exist at the inside near an outer peripheral area of the ceramic laminate 10.

Said ceramic laminate 10 comprises stress relaxation parts 13 of which each is adjacent to at least a part of the internal electrode layer 12 in the stacking direction, and can modify their own shape more easily than the ceramic layer 11.

Each of the stress relaxation parts 13 is located so as to overlap with the non-pole part 129 of either of the internal electrode layers 12 in the stacking direction of the ceramic laminate 10.

This content is explained in details as follows. The ceramic laminate 10 of this Example is, as shown in FIG. 1, formed by stacking in alternate order 400 layers of the ceramic layers 11 with a diameter of 8 mm and a thickness of 80 μm, made of ceramic material, and the internal electrode layers 12 with a diameter of 7.5 mm and a thickness of 3 μm, formed over all of the stacking area.

This ceramic laminate 10 is, as shown in FIG. 1, in sectional shape of a barrel, by forming a pair of connecting areas 15, mutually facing, on an outer peripheral area of the laminate in shape of about a column.

The sectional shape of the ceramic laminate 10 is not limited to the barrel of this Example, and can be modified to polygonal such as rectangular according to applications and states at use.

Each of the internal electrode layers 12 exposes outer peripheral end part of the internal electrode layer 12 only at either of the connecting areas 15, and does not exist at the inside near the outer peripheral part of the internal electrode part 120, except for one side of the connecting areas 15 exposing the internal electrode part 120.

The every other internal electrode layer 12 exposing the internal electrode part 120 at one side of the connecting areas 15 forms the non-pole part 129 where the internal electrode part 120 does not exist at the inside near the outer peripheral part at other side of the connecting areas 15. The every other internal electrode layer 12 exposing the internal electrode part 120 at the other side of the connecting areas 15 forms the non-pole part 129 where the internal electrode part 120 does not exist at inside of the outer peripheral part at the one side of the connecting areas 15.

In other words, the ceramic laminate 10 of this Example has a so-called partial electrode structure comprising the non-pole part 129 where the internal electrode part 120 does not exist at inside of a part of the outer peripheral end part. The ceramic laminate 10 of this Example improves electric insulation reliability at the connecting areas 15 and outer peripheral insulation area of the outer peripheral area except for the connecting areas 15, by employing this partial electrode structure.

Further, the ceramic laminate 10 of this Example has the stress relaxation parts 13 as gaps in shape of a slit over all of the outer peripheral part of the ceramic laminate 10 along the every other internal electrode layers 12.

In this Example, as shown in FIG. 2, a width W of a part forming the stress relaxation part 13, where the width W is 0.3 mm, is a little widened, while a width G of the non-pole part is 0.25 mm, so that the stress relaxation part 13 overlaps with said non-pole part 129, by containing the non-pole part 129.

In this Example, the stress relaxation part 13 is formed as a gap in shape of a slit with a thickness of 6 μm, against the ceramic layer 11 with a thickness of 80 μm.

The laminate-type piezoelectric element 1 of this Example is, as shown in FIG. 2, formed by connecting an external electrode 18 to the connecting area 15 with resin silver 180, electrically conductive resin material with adhesive properties, and then by molding over all of outer peripheral area with molding resin 185.

As the resin silver 180 and the molding resin 185 used in this Example, materials having viscosity at a certain extent in usage conditions were used. In other words, the material was used, which shows less possibility of causing capillarity, etc. against the stress relaxation parts 13 with a thickness of 6 μm, and shows viscosity of which there is extremely little possibility of penetrating into its inside.

Therefore, in this Example, the stress relaxation parts 13, formed as a gap in shape of a slit in the ceramic laminate 10, maintain the state of the gap as it is, after being incorporated in the laminate-type piezoelectric element 1.

A method for manufacturing the laminate-type piezoelectric element 1 in this Example is then illustrated. Herein, a step of forming said ceramic laminate 10 characterizing the laminate-type piezoelectric element 1 in this Example is especially explained as a central matter.

Figure 3:
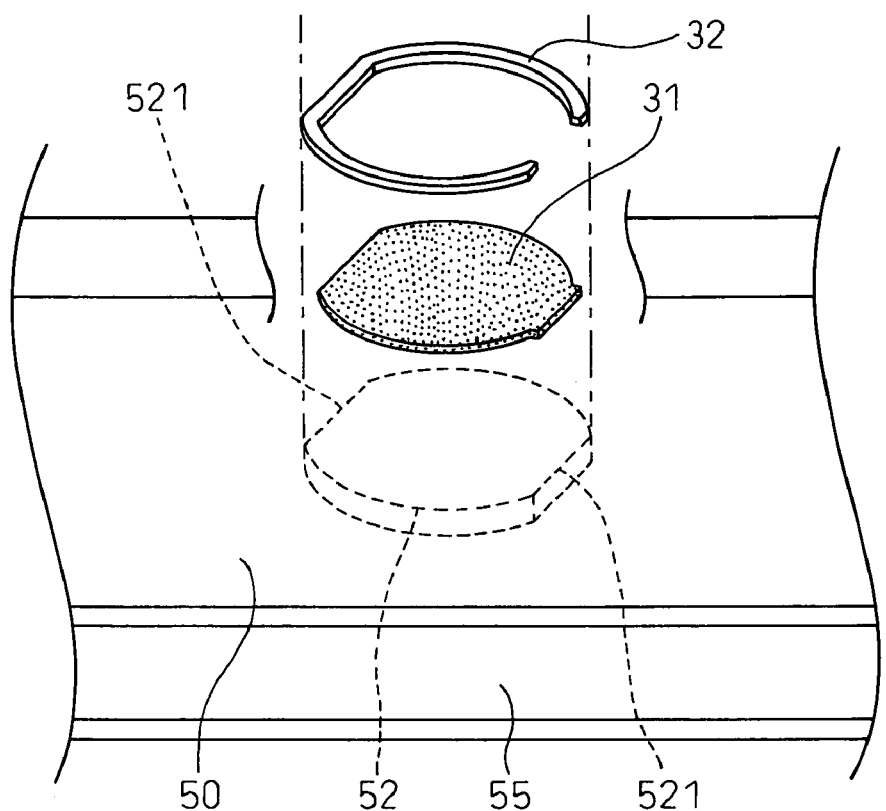
FIG. 3 is an illustrative drawing to illustrate contents of an electrode-placing step in Example 1.
Figure 9:
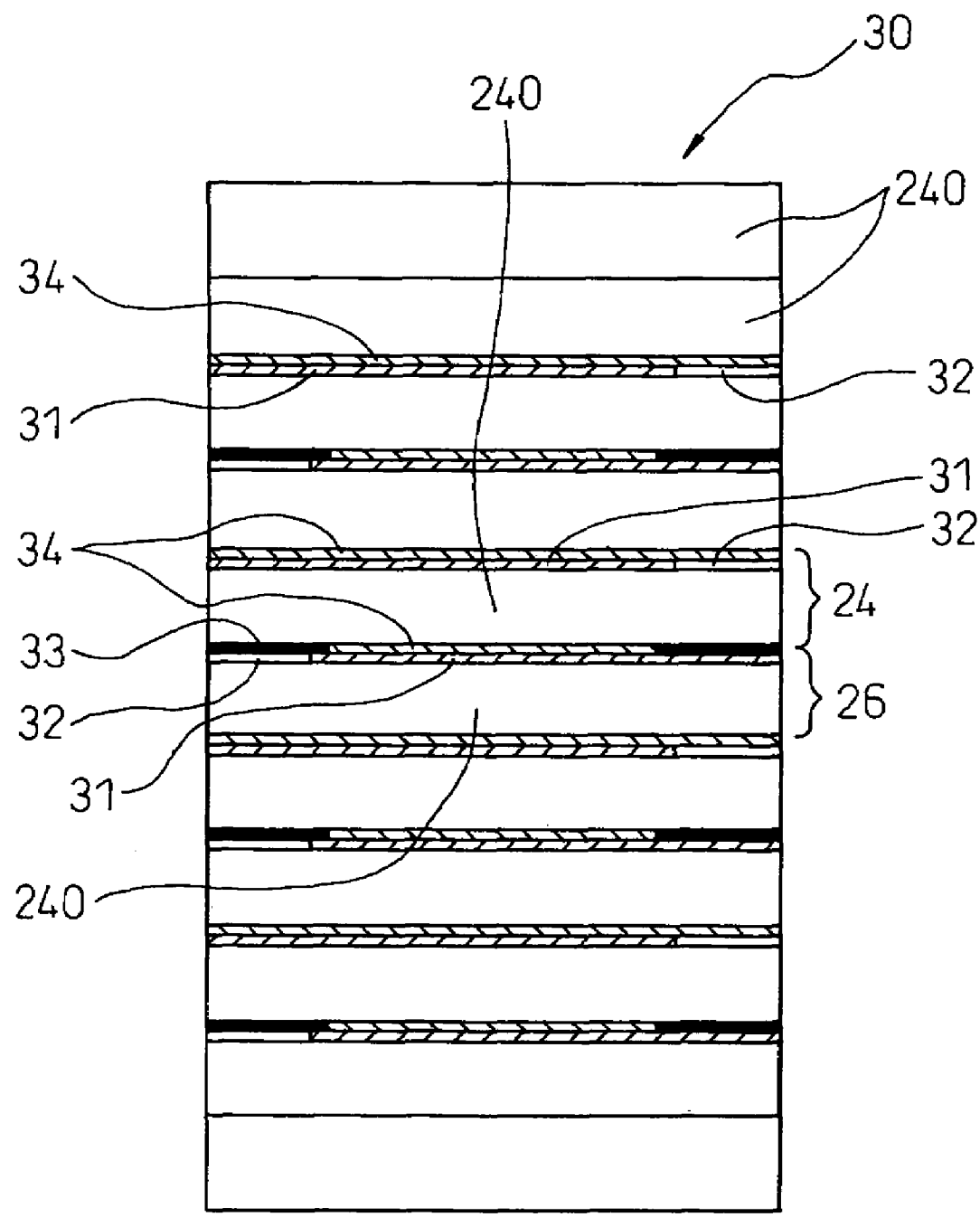
FIG. 9 is a sectional drawing to illustrate a sectional structure of an intermediate laminate in Example 1.
Figure 10:
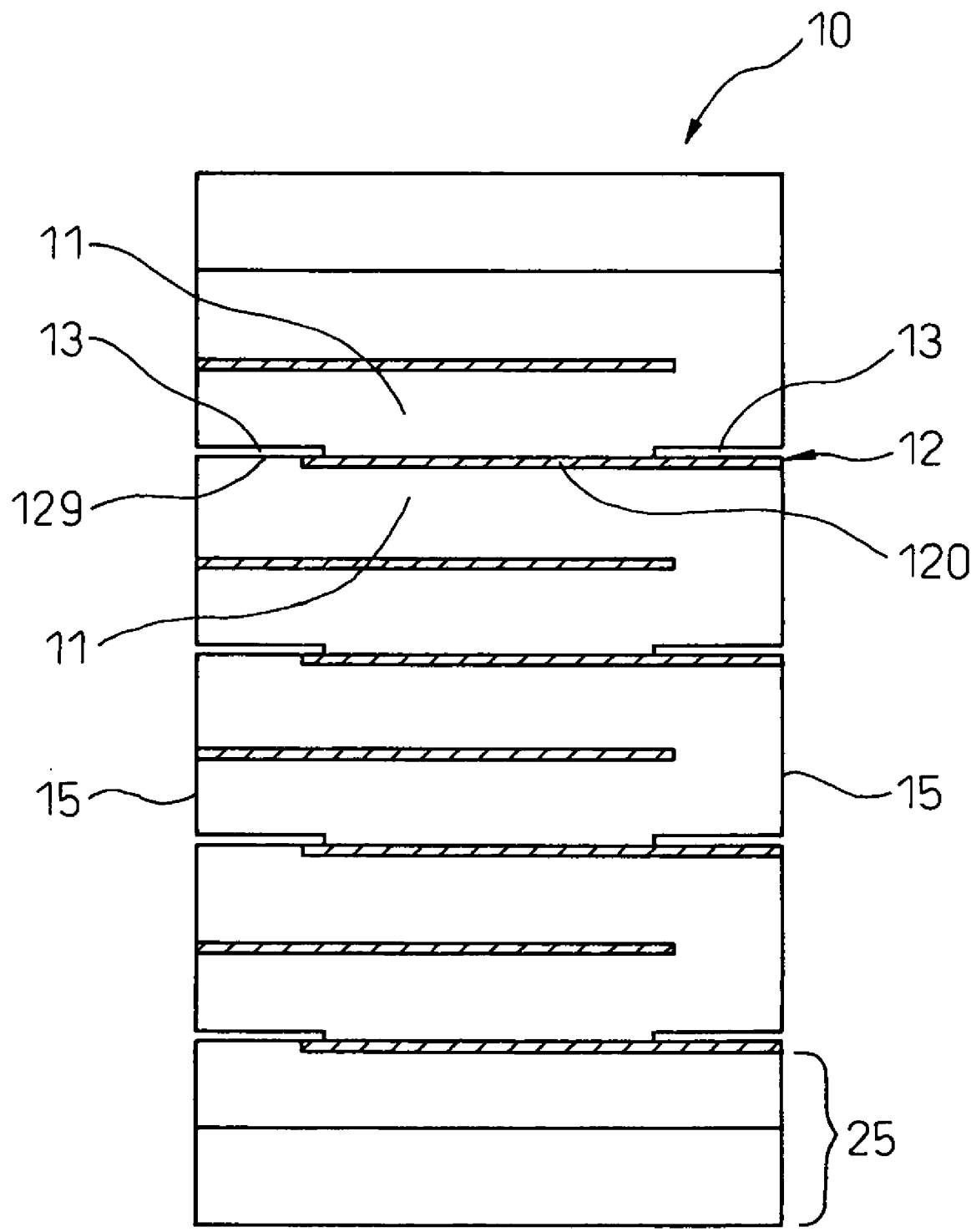
FIG. 10 is a sectional drawing to illustrate a sectional structure of a ceramic laminate in Example 1.
Figure 11:
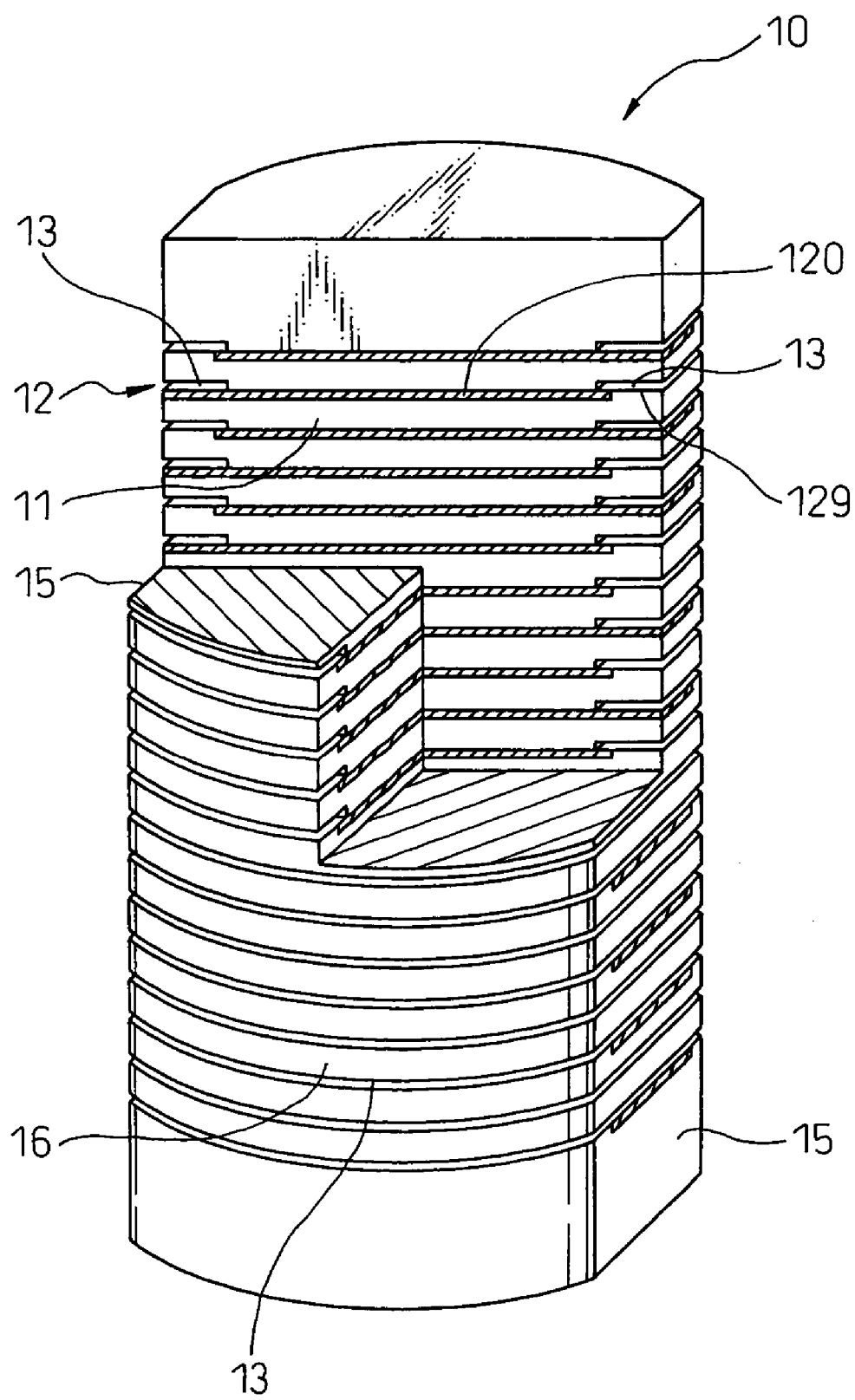
FIG. 11 is a structural drawing to illustrate a stacked structure of an alternative ceramic laminate in Example 1.
Figure 12:
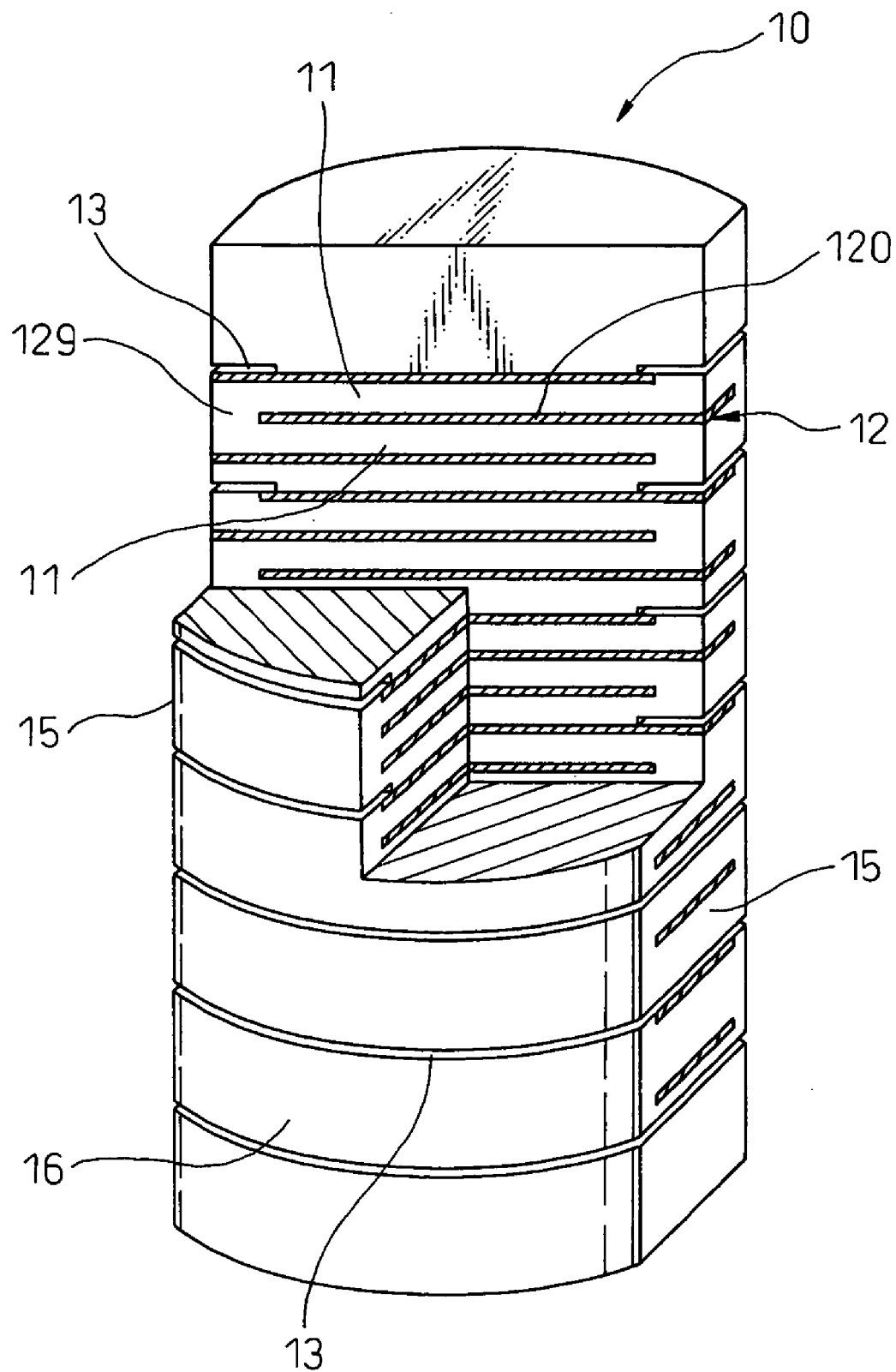
FIG. 12 is a structural drawing to illustrate a stacked structure of an alternative ceramic laminate in Example 1.
Figure 13:
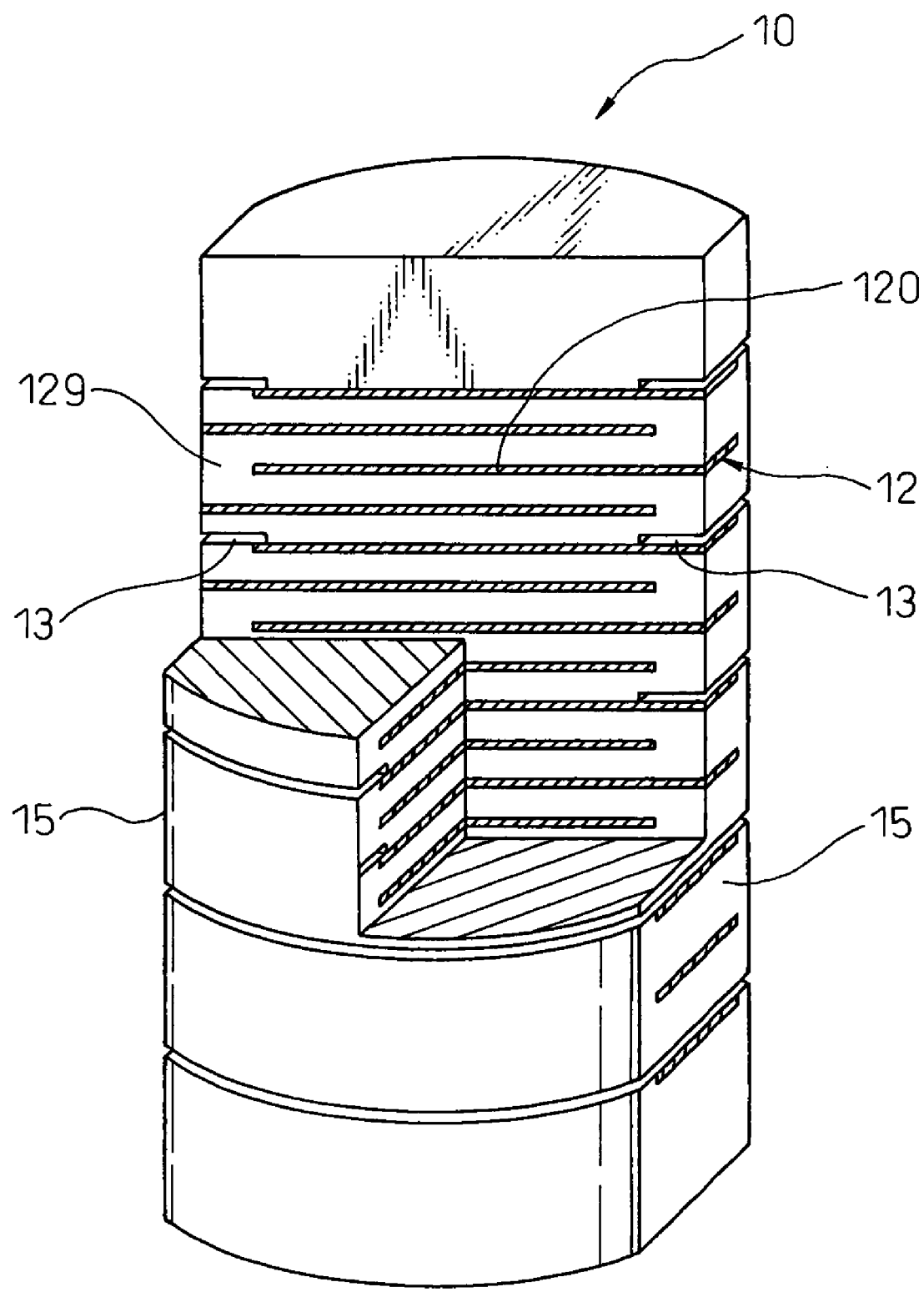
FIG. 13 is a structural drawing to illustrate a stacked structure of an alternative ceramic laminate in Example 1.

For forming the ceramic laminate 10, as shown in FIG. 3, a process to be carried-out comprises a green sheet forming step to form a green sheet 50 in shape of a sheet composed of ceramic material; an electrode placing step to place an electrode material 31 for forming internal electrode parts 120 by calcining, while remaining a part for forming the non-pole part 129 (see FIG. 1) of a cut-out area to cut out a sheet piece 24 (see FIG. 4) of the green sheet 50; a stress relaxation material placing step to place a stress relaxation material 33, comprising at least partly vanishing material to be vanished by calcining, on at least a part of the cut-out area 52 having been applied the electrode placing step; a cutting-out step to obtain sheet pieces 24 and 26 (see FIG. 4 and FIG. 6) by cutting out the cut-out area 52; a stacking step to form an intermediate laminate 30, to become the ceramic laminate 10 via calcining, by stacking the sheet piece 24 and 26 cut out, as shown in FIG. 9; and a calcining step to obtain the ceramic laminate 10 with said stress relaxation parts 13 formed by vanishing the vanishing material in the stress relaxation material 33 by calcining the intermediate laminate 30, as shown in FIG. 1 and FIG. 10.

For forming the ceramic laminate 10 of this Example, the green sheet forming step is initially carried out to form a green sheet 50 (see FIG. 3) by spreading a slurry of material for piezoelectric element in shape of a sheet. Herein, the slurry is a material obtained by adding a binder and small amounts of plasticizer and an anti-foaming agent to ceramic material of lead titanate zirconate (PTZ) and the like to become piezoelectric ceramics, and then dispersing them into an organic solvent.

In the green sheet forming step, the slurry was applied on a carrier film 55 (see FIG. 3) by a doctor blade method, and the green sheet 50 with a thickness of 100 μm was formed. As a method for forming the green sheet 50 from the slurry, an extrusion molding method and the like, as well as the doctor blade method can be employed.

Then, in said electrode placing step, as shown in FIG. 3, the electrode material 31 is placed on an inner peripheral part at a cut-out area 52 of the green sheet 50, and an outer peripheral part composed of one of straight parts 521 of the cut-out area 52 in shape of a barrel.

In this Example, in order to approximately match a height of a part placed the electrode material 31 at the cut-out area 52, and a printing height of other part, a spacer part 32 composed of the slurry was printed in a gap between an outer edge of an area placed the electrode material 31 and an outer edge of the cut-out area 52.

Figure 4:
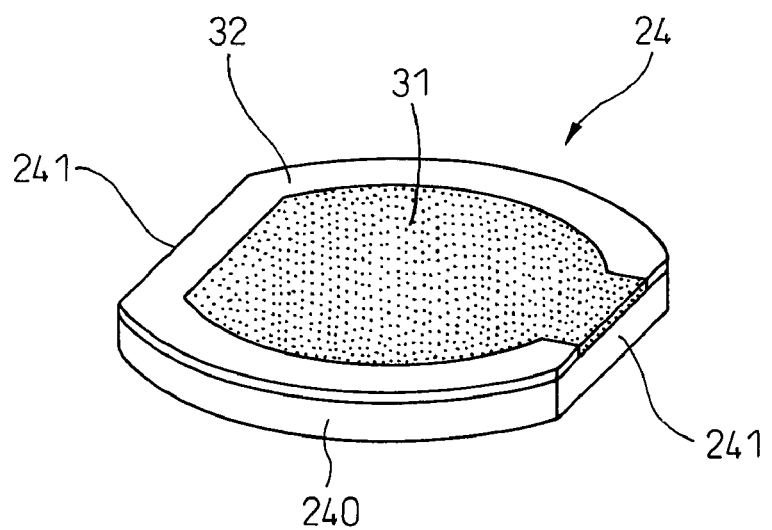
FIG. 4 is a perspective drawing to illustrate the first piece of sheet pieces cut out from a green sheet in Example 1.

Consequently, in said cutting-out step as a later process, when the cut-out area 52 applied the electrode placing step is cut out, as shown in FIG. 4, the sheet piece 24 can be obtained, in which the electrode material 31 is placed on the inner peripheral part at a cut-out area 101 so as to contact with the outer peripheral part only at one of straight lines 241 of a ceramic material layer 240 in shape of a barrel. As the spacer part 32 is placed on the surface of the sheet piece 24 of this Example, the sheet piece 24 has an approximately flat surface suitable for stacking.

This spacer part 32 is a part for forming said non-pole part 129 (see FIG. 1) in the calcined ceramic laminate 10.

Figure 5:
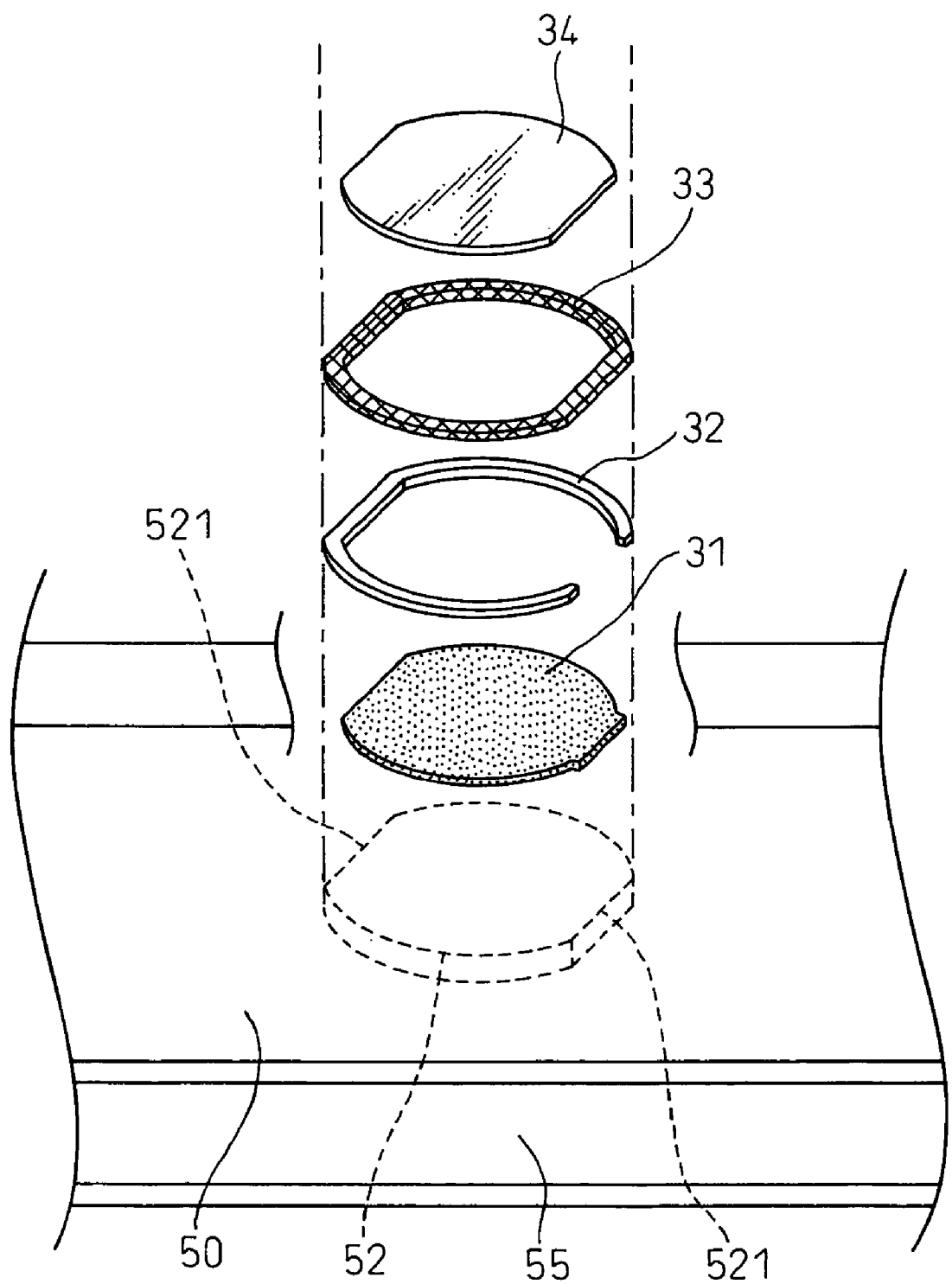
FIG. 5 is an illustrative drawing to illustrate contents of an electrode-placing step and a stress relaxation material placing step in Example 1.

Then, in said stress relaxation material placing step, as shown in FIG. 5, a relaxation material 33, consisting of only a vanishing material to be vanished by calcining, is further placed along all of outer peripheral part of the cut-out area 52 applied in said electrode placing step.

In this Example, for purposes of matching approximately the printing height with the outer peripheral part placed the relaxation material 33, and of improving an adhesive effect for stacking, an adhesive part 34 composed of said slurry was placed in the inner peripheral part of the cut-out area 52.

In this Example, as said vanishing material, a material composed of carbon particles, which occurs less thermal modification, and can maintain high the degree of shape accuracy of said stress relaxation part 13 (see FIG. 1), was used.

Carbonized organic particles in the form of a powder, as well as the carbon particles of this Example, can be used. These carbonized organic particles can be obtained by carbonizing organic particles in powder, and also by pulverizing carbonized organic material.

Further, as said organic material, high molecular materials such as a resin, corn, soybean, wheat and the like can be utilized. In this case, costs for manufacturing can be restrained. Especially, if corn, soybean, wheat or the like is used, said ceramic laminate 10 can be manufactured by using natural material friendly to the environment.

Figure 6:
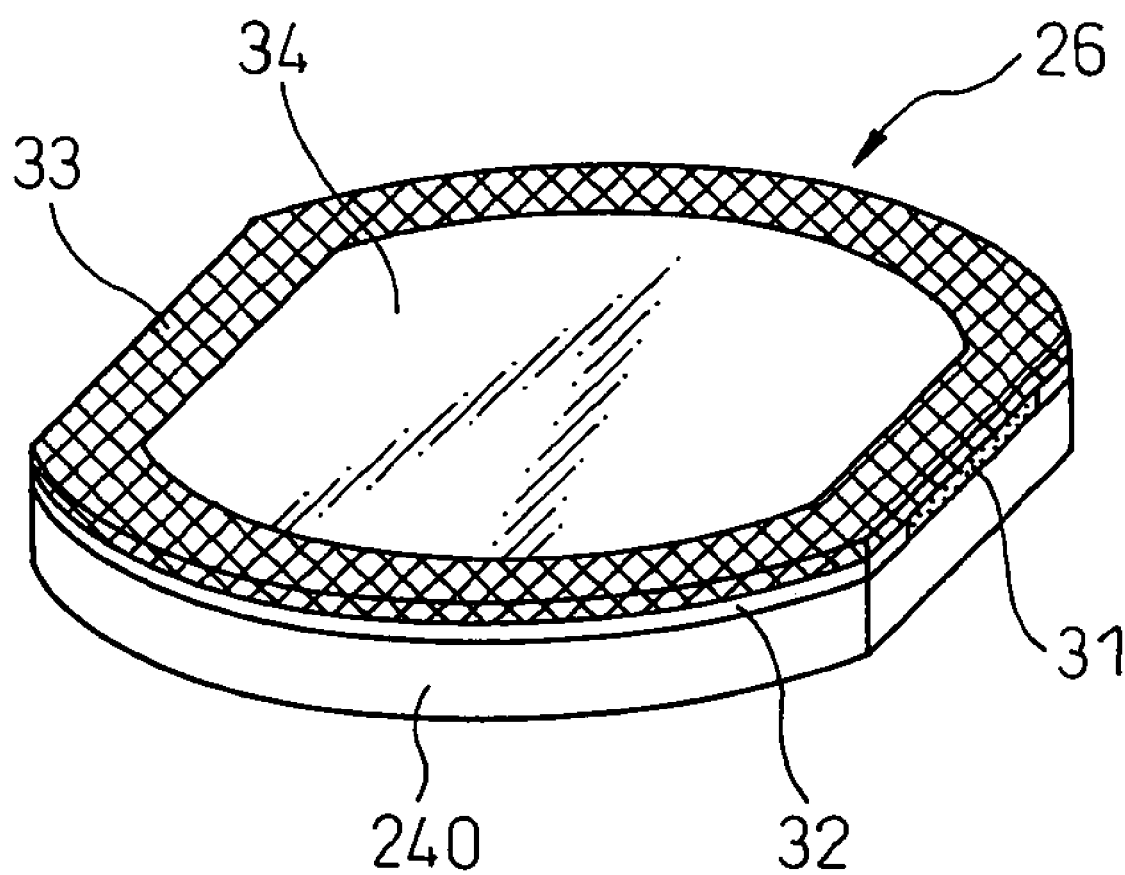
FIG. 6 is a perspective drawing to illustrate the second piece of sheet pieces cut out from a green sheet in Example 1.

Therefore, in said cutting-out step as a later process, if the cut-out area 52 applied said stress relaxation material placing step is cut out, after applying the electrode placing step, as shown in FIG. 6, the sheet piece 26 can be obtained, in which the stress relaxation material 33 is placed over all of the outer peripheral part along a layer placed the electrode material 31 for forming internal electrode layer 12 (see FIG. 1) by calcining. Herein, as the adhesive part 34 is placed on the inner peripheral side of the stress relaxation material 33, the sheet piece 26 has an approximately flat surface suitable for stacking.

The outer peripheral part placed the stress relaxation material 33 is a part for forming the stress relaxation part 13 (see FIG. 1) making a gap in shape of a slit in the calcined ceramic laminate 10.

Figure 7:
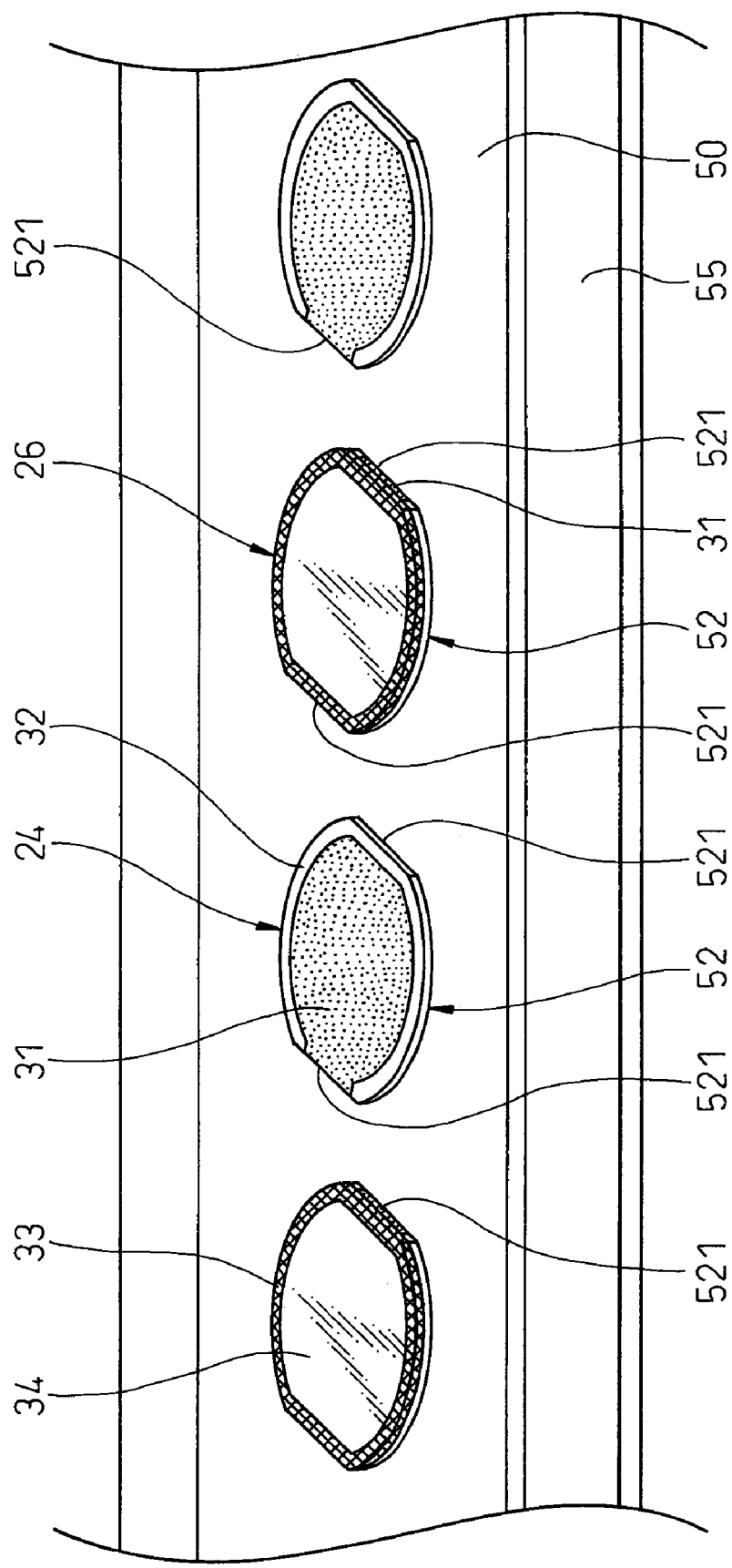
FIG. 7 is a perspective drawing to illustrate a green sheet for cutting out sheet pieces in Example 1.

In this Example, as shown in FIG. 7, the cut-out areas 52 for the sheet piece 24 and the cut-out areas 52 for the sheet piece 26 were placed in alternate order in the longitudinal direction on the green sheet 50 formed long in the longitudinal direction so that the sheet pieces 24 and the sheet pieces 26 can be stacked in alternate order while being cut out efficiently.

The straight part 521 where the electrode material 31 contacts at the cut-out area 52 for the sheet piece 24, and the straight part 521 where the electrode material 31 contacts at the cut-out area 52 for the sheet piece 26 are placed in alternate order so that they face in the reverse direction.

Figure 8:
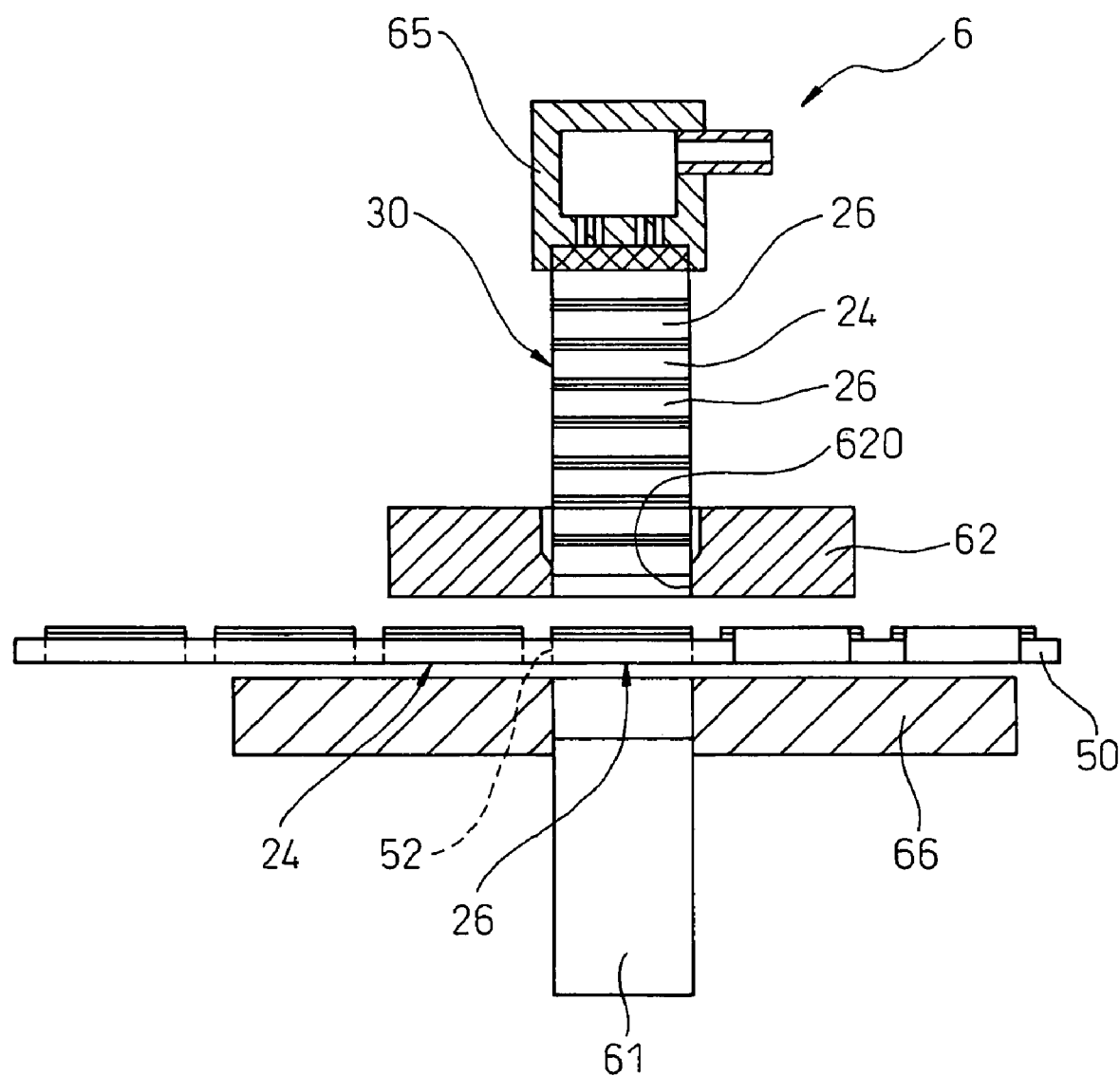
FIG. 8 is an illustrative drawing to illustrate a state of cutting-out and stacking of sheet pieces by a cutting-stacking equipment in Example 1.

In this Example, as shown in FIG. 8, both of cutting-out and stacking of the sheet pieces 24 and 26 are then carried out in parallel, by using a cutting-stacking equipment 6 composed so as to simultaneously proceed with said cutting-out step and said stacking step. Herein, as shown in FIG. 8, the intermediate laminate 30 is formed by cutting out the sheet pieces 24 and 26 from the green sheet 50, and by successively stacking them.

A construction and an operation of the cutting-stacking equipment 6 in this Example are described below. The cutting-stacking equipment 6 is, as shown in FIG. 8, composed so as to carry out cutting-out the sheet pieces 24 and 26 and stacking them in parallel.

This cutting-stacking equipment 6 comprises a laminate holder with a hollow structure, not shown in Figures, a punch 61 stroking toward the laminate holder, a hole 620 having the punch 61 passed through, a die 62 placed at the lower end of the laminate holder, and a positioning table 66 where the green sheet 50 is positioned so at to face with the die 62.

Said cutting-stacking equipment 6 is composed so as to cut out the sheet pieces 24 and 26 from the green sheet 50, by combining the punch 61 and the die 62.

Further, at the inside of the laminate holder, a guide 65 as a weight material forming a clinging surface at the lower end area is placed so as to move in the stroking direction of the punch 61. By using this guide 65, the formed intermediate laminate 30 can be maintained as being pressed in the stacking direction.

For manufacturing the intermediate laminate 30 by using said cutting-stacking equipment 6, as shown in FIG. 8, the green sheet 50 released from the carrier film 55 (see FIG. 7) is positioned on the positioning table 66, and the cut-out area 52 (see FIG. 7) is matched to a cutting position of the punch 61.

After that, while moving on the green sheet 50 in the longitudinal direction, the sheet pieces 24 and the sheet pieces 26 are cut out in alternate order, and the cut-out pieces are stacked at the inside of the laminate holder. Then, as shown in FIG. 9, the intermediate laminate 30 is formed at the inside of the laminate holder.

In the intermediate laminate 30 of this Example, as shown in FIG. 9, two ceramic material layers 240 are overlapped at both ends of them in the stacking direction. The two ceramic material layers 240, as shown in FIG. 10, form protective layers 25 at both ends of the ceramic laminate 10 by calcining.

Then, at the calcining step, the ceramic laminate 10 is obtained by calcining said intermediate laminate 30. In the calcining step of this Example, calcining was carried out with a calcining oven, not shown in Figures.

The calcining oven was gradually heated by taking 15 hours until the temperature inside of the oven reached 1050° C., calcining was carried out by maintaining the inside temperature for 2 hours, and the oven was then cooled.

If the temperature of the inside of the oven is controlled as described above, while maintaining with the good accuracy the shape of the part where the stress relaxation material 31 of the intermediate laminate 30 is placed, the ceramic material forming the ceramic material layer 240, etc. can be calcined. Further, by vanishing the stress relaxation material 31 during the course of calcining the ceramic material, the stress relaxation parts 13 can be formed with the good accuracy of the shape. If the stress relaxation parts 13 is formed with a good accuracy of the shape, the stacking accuracy and the strength of the whole ceramic laminate 10 obtained by calcining can be improved.

As shown in FIG. 9 and FIG. 10, in the ceramic laminate 10 obtained, the ceramic material layer 240 forms the ceramic layer 11 by calcining, and the adhesive part 34 composed of the slurry forms a part of the ceramic layer 11 by calcining.

Further, the electrode material 31 forms the internal electrode part 120 by calcining, and the spacer part 32 composed of the slurry forms the non-pole part 129 composed of the ceramic material. The internal electrode part 120 and the non-pole part 129 form the internal electrode layer 12.

On the other hand, the stress relaxation material 33 consisting of only said vanishing material vanishes by calcining, and forms the stress relaxation part 13 of a gap in shape of a slit.

Especially, by using the stress relaxation material 33 composed of carbon particles of this Example, the stress relaxation part 13 can be formed with the good shape accuracy.

The laminate-type piezoelectric element 1 of this Example, as shown in FIG. 2, is obtained by attaching an external electrode 18 to the ceramic laminate 10 formed as described above, and molding the outer peripheral area.

To the connecting area 15 of the ceramic laminate 10, the external electrode 18 is connected, by using the resin silver 180. The outer peripheral area of the ceramic laminate 10, after having connected the external electrode 18, is covered over all of the peripheral part with the molding resin 185.

As described above, the ceramic laminate 10 of this Example comprises the stress relaxation parts 13 as a gap in shape of a slit over all of outer peripheral part of the ceramic laminate 10 along the every other internal electrode layer 12.

In other words, in said ceramic laminate 10, the stress relaxation parts 13 are placed so as to overlap with the non-pole parts 129, which do not cause a piezoelectric effect, in the stacking direction.

Based on these stress relaxation parts 13, the stresses can be restrained, which act on the non-pole parts 129 in the ceramic laminate of a common partial electrode structure without the stress relaxation parts 13.

Especially, in the ceramic laminate 10 with a plurality of stacked layers like this Example, there is a high possibility of increasing of the stresses by overlapping in the stacking direction, based on that a plurality of non-pole parts 12 overlap in the stacking direction.

For that reason, in the laminate-type piezoelectric element 1 of this Example, the stress relaxation parts 13 can act extremely effectively for restraining the stress acting on the non-pole parts 129.

In the ceramic laminate 10 of this Example, at the non-pole parts 129 of the internal electrode layers 12 positioning along the stress relaxation parts 13, the stress relaxation parts 13 are formed as gaps in shape of a slit so as to be adjacent to the non-pole parts 129.

For that reason, in the laminate-type piezoelectric element 1 incorporated said ceramic laminate 10, the possibility that the stresses act on the non-pole parts 129 adjacent to the stress relaxation parts 13 is significantly small.

On the other hand, in the non-pole parts 129 not adjacent to the stress relaxation parts 13, the overlapping stress, acting from the stacking direction, can be cut off by the stress relaxation parts 13, adjacent by sandwiching the non-pole part 129 in the stacking direction.

On that account, in the non-pole parts 129 not adjacent to the stress relaxation parts 13, it can be prevented that the overlapping stress act from the stacking direction. Therefore, it can be effectively restrained that the stresses acting on the non-pole parts 129 become too large.

Thus, also in the internal electrode layers 12 not adjacent to the stress relaxation parts 13, the stresses acting on the non-pole parts 129 can become significantly small.

In the laminate-type piezoelectric element 1 of this Example composed by using the ceramic laminate 10, where the stresses acting on the non-pole parts 129 are restrained as mentioned above, the possibility of causing releases between layers based on strains by piezoelectric displacement is small. The laminate-type piezoelectric element 1 is excellent, which can show its initial performance for a long period.

The laminate-type piezoelectric element 1, being restraining the stresses inhibiting piezoelectric effect, has an excellent performance including high piezoelectric efficiency.

In the stress relaxation parts 13 in a shape of a slit of this Example, a material such as an insulation material was not filled, and the gaps remained as they were, however, the insulation material can be filled inside of the stress relaxation parts 13, in place of this Example.

As the insulation material, for example, materials with excellent flexibility such as silicone potting materials (e.g. Three Bond 1230 manufactured by Three Bond Co., Ltd. Japan), polyimide resins and the like can be preferably utilized. By using these materials, the stress relaxation parts 13 with a little gap inside can be formed, by filling the insulation material, and then having the insulation material shrink by heating and drying. In this case, via the gap formed inside, electric insulation reliability can be improved, while maintaining the stress-restraining effect high by the stress relaxation parts 13.

Filling the insulation material can be carried out with extremely high efficiency, for example, by using dispenser equipment for ejecting insulation material in liquid form from a dispensing nozzle.

In other words, it can be possible to fill the insulation material via capillarity with very high efficiency, by ejecting the insulation material in liquid form from a dispensing nozzle nearby an opening of the stress relaxation part in shape of a slit.

In each of the connecting areas 15 of the ceramic laminate 10, it also can be carried out to connect the external electrodes 185, by using the same resin silver 180 as this Example, after connecting a baked electrode to the outer peripheral end part of the each internal electrode part 120 exposing at the connecting area 15. By using said baked electrode, a strength of connecting with the outer peripheral end part of the internal electrode part 120 can be improved, and a connecting state between both can become maintained with high reliability for a long term.

Further, in the ceramic laminate 10 of this Example, the stress relaxation parts 13 were formed along every other internal electrode layer 12, however, the stress relaxation parts 13 can be formed along all of the internal electrode layers 12 (see FIG. 11), along every two internal electrode layers 12 (see FIG. 12), or along every three internal electrode layers 12 (see FIG. 13), instead of this Example. Further, it also is possible that the stress relaxation parts 13 are formed along every four or more internal electrode layers 12, but not shown in Figures.

Herein, an effect of reducing the stresses acting on the non-pole parts 129 can be improved, by narrowing intervals for placing the stress relaxation parts 13. On the other hand, a stacking accuracy and a strength of the ceramic laminate 10 can be improved, by widening the intervals for the stress relaxation parts 13.

Especially, by forming the stress relaxation parts 13 along every one or more and 3 or less internal electrode layers 12, the laminate-type piezoelectric element 1 with an excellent quality maintaining at high level both of the effect of reducing the stresses acting on the non-pole parts 129, and the stacking accuracy and strength of the ceramic laminate 10 can be obtained.

Example 2

This Example is an example, based on the ceramic laminate of Example 1, and modifying a shape for placing the stress relaxation parts in a stacking sectional area. The content of this Example is explained below, by using FIGS. 14-19.

Figure 14:
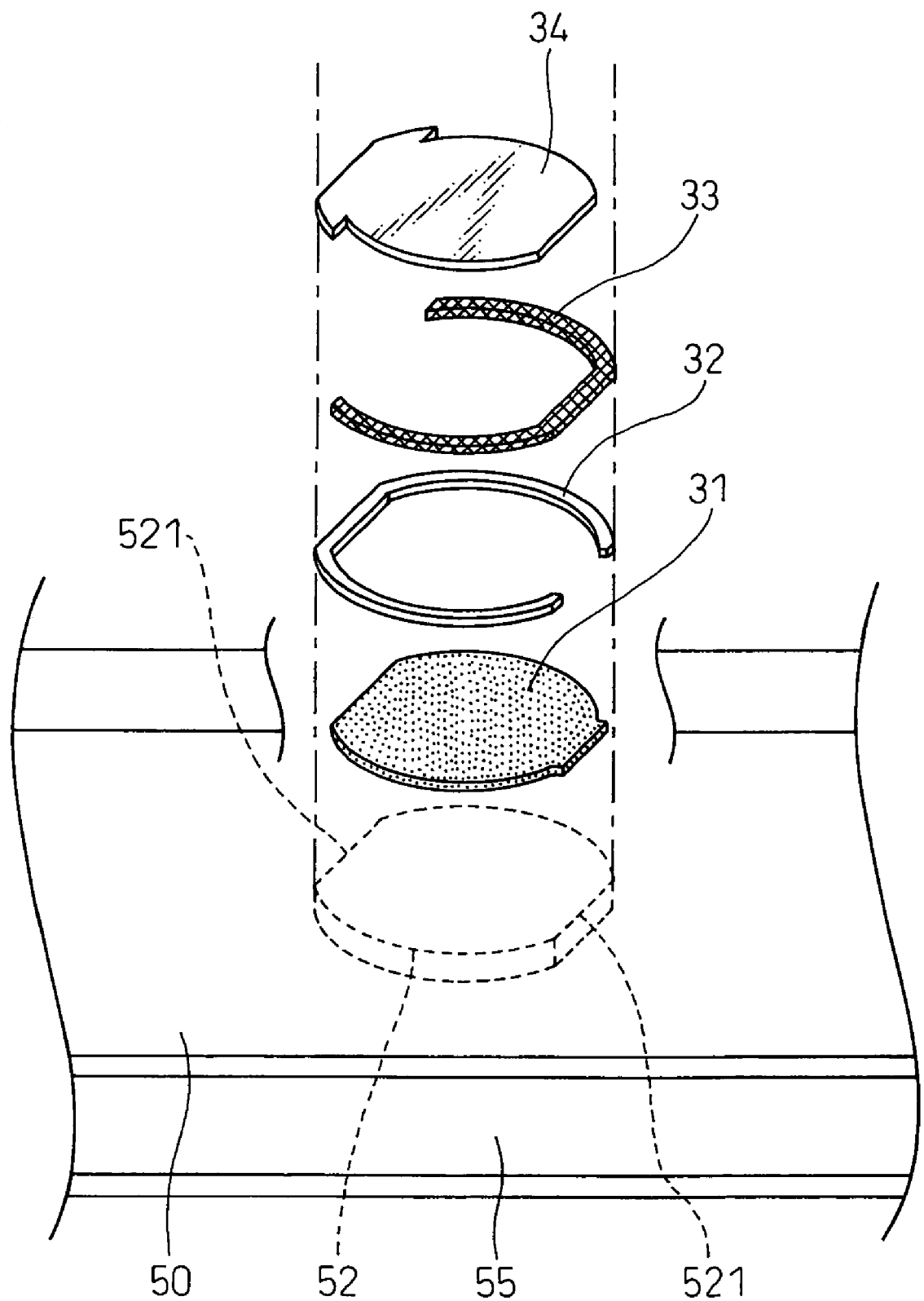
FIG. 14 is an illustrative drawing to illustrate contents of an electrode-placing step and a stress relaxation material placing step in Example 2.

In said stress relaxation material placing step of this Example, as shown in FIG. 14, the stress relaxation material 33 is not placed in one straight part 521, for ceasing the electrode material 31, of a pair of straight parts 521 at the cut-out area 52 in shape of a barrel.

Figure 15:
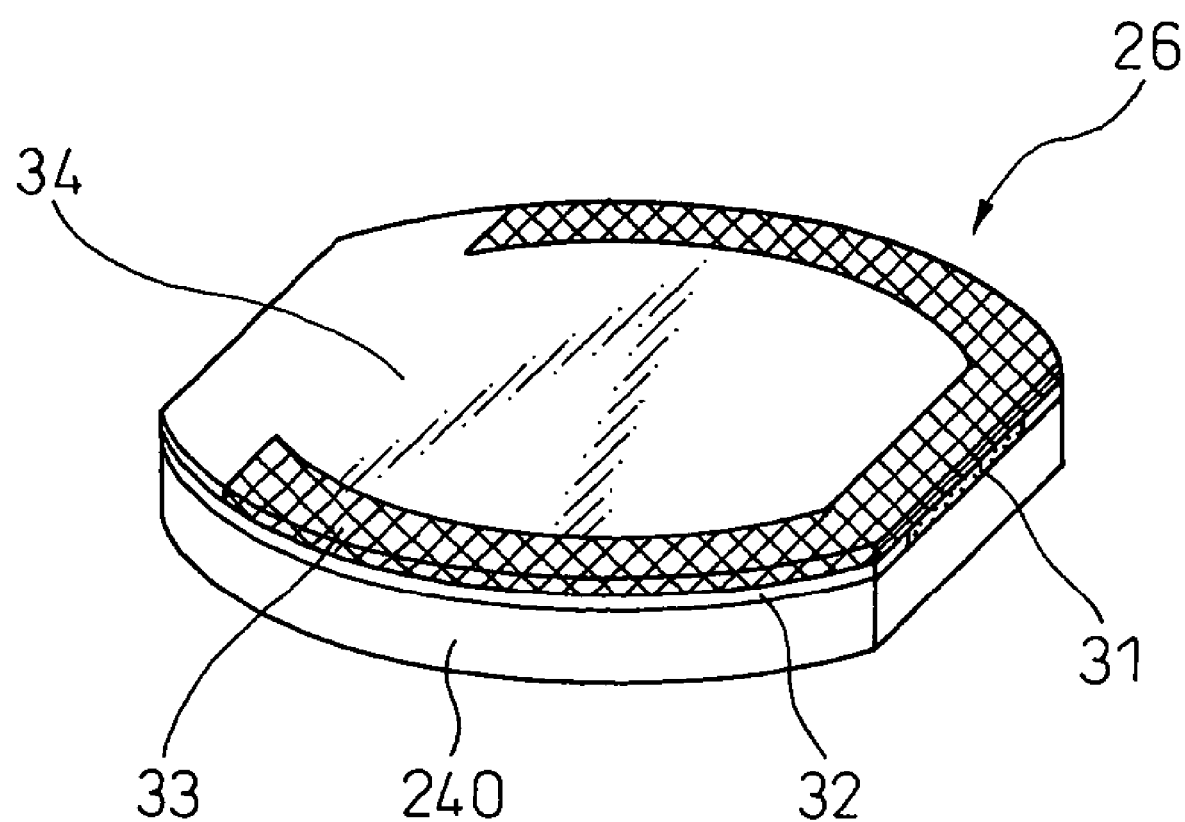
FIG. 15 is a perspective drawing to illustrate sheet pieces cut out from a green sheet in Example 2.

Therefore, in said cutting-out step as a later process, if the cut-out area 52 applied said stress relaxation material placing step is cut out, after applying the same electrode placing step as Example 1, as shown in FIG. 15, a sheet piece 26 can be obtained, including the electrode material, in which the stress relaxation material 33 is placed at the outer peripheral part except for said one straight part 521 (see FIG. 14), along a layer forming the internal electrode layer 12 (see FIG. 17) by calcining.

Figure 16:
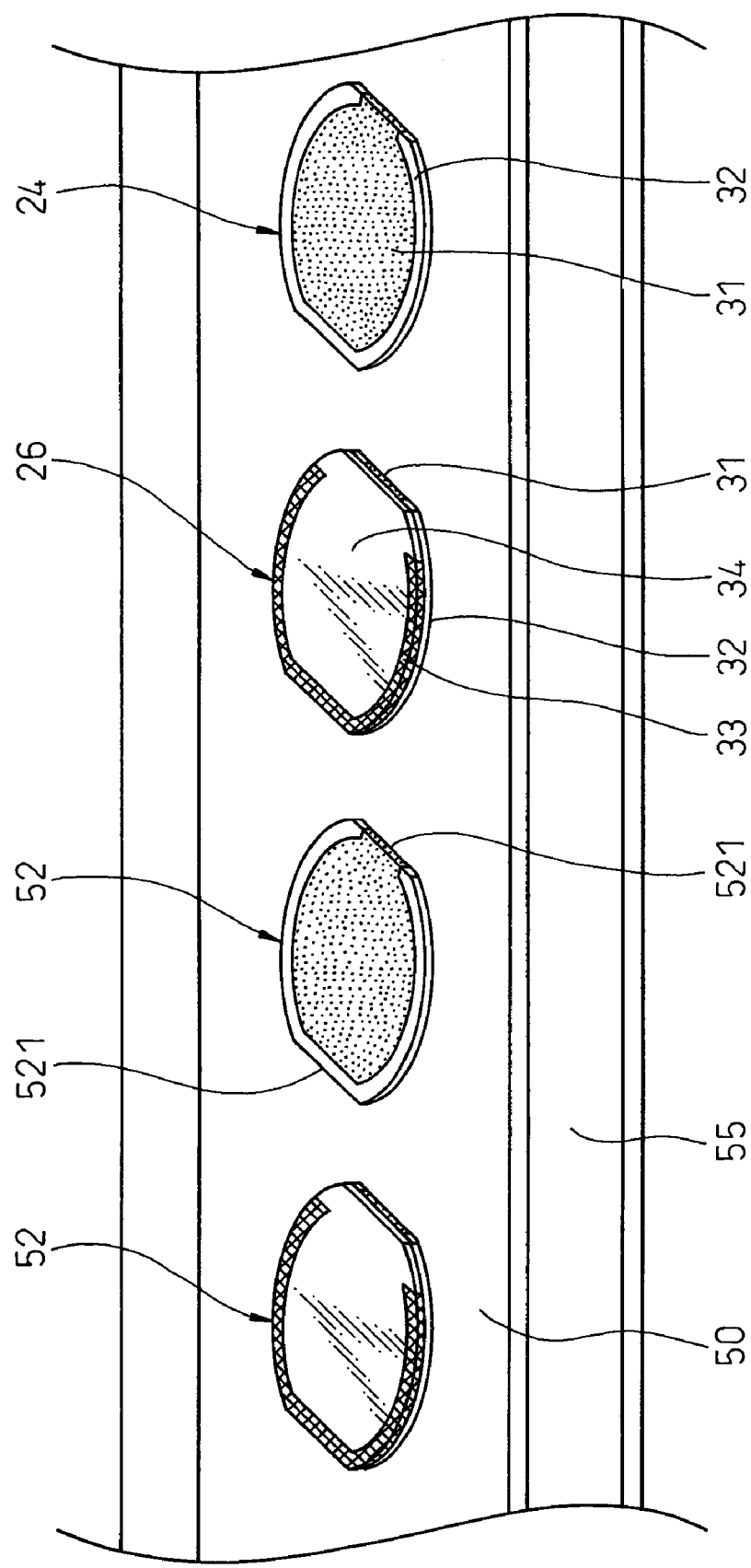
FIG. 16 is a perspective drawing to illustrate a green sheet for cutting out sheet pieces in Example 2.

In this Example, as shown in FIG. 16, the cut-out areas 52 for the sheet piece 24 and the cut-out areas 52 for the sheet piece 26 were placed in alternate order in the longitudinal direction on the green sheet 50 formed long in the longitudinal direction so that the sheet pieces 24 (see FIG. 4) and the sheet pieces 26 can be stacked in alternate order with being cut out efficiently.

The straight part 521 where the electrode material 31 contacts at the cut-out area 52 for the sheet piece 24, and the straight part 521 where the electrode material 31 contacts at the cut-out area 52 for the sheet piece 26 are placed in alternate order so as to face in the reverse direction.

Figure 17:
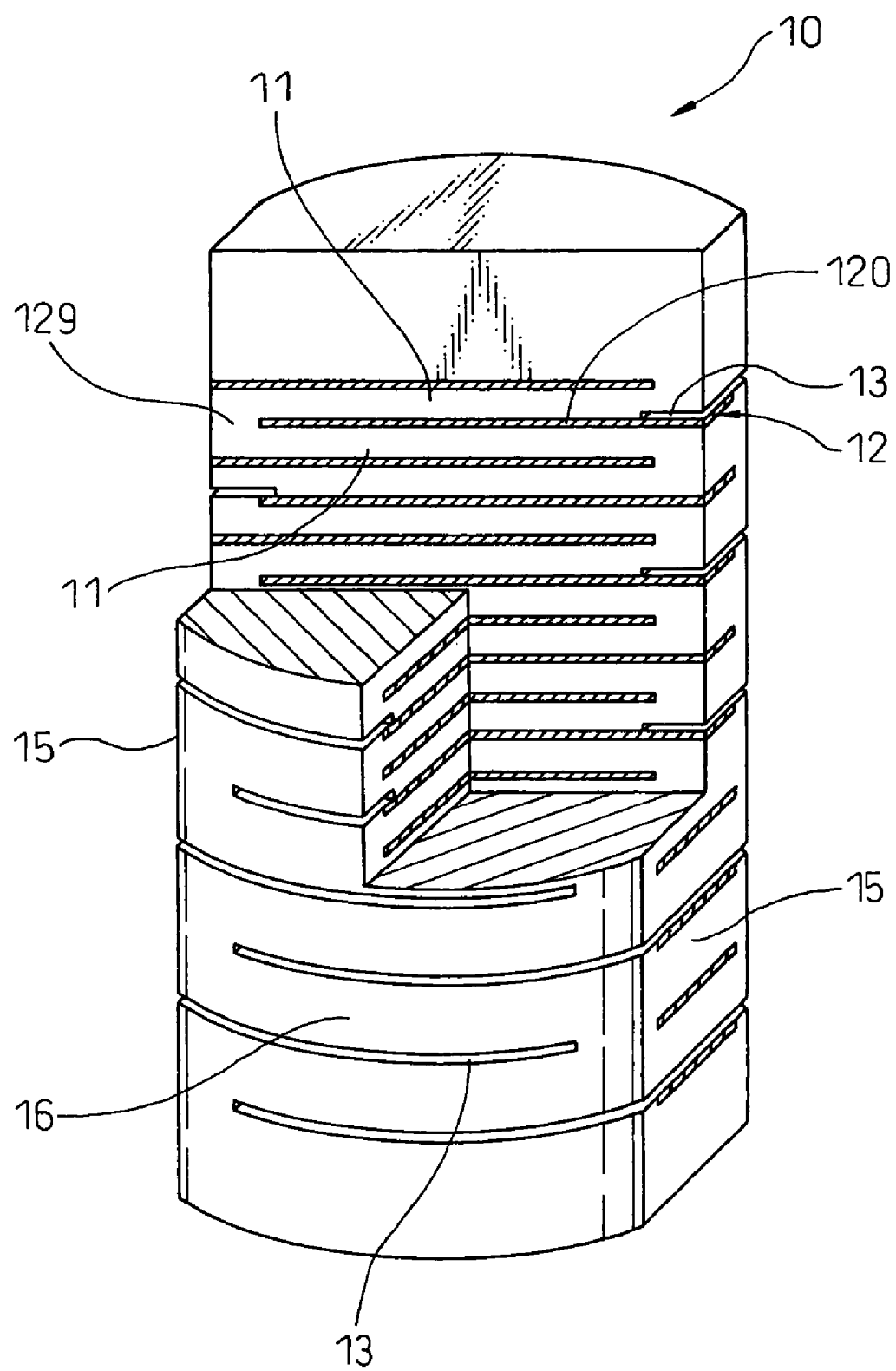
FIG. 17 is a structural drawing to illustrate a stacked structure of a ceramic laminate in Example 2.

The sheet pieces 26 and the sheet pieces 24, which were cut out in alternate order from the green sheet 50 being long in the longitudinal direction, are successively stacked, and the intermediate laminate, not shown in Figures, is obtained. After that, if this intermediate laminate is calcined, as shown in FIG. 17, the ceramic laminate 10 is obtained, in which the stress relaxation part 13 is not formed at the connecting area 15 forming the non-pole part 129, and the stress relaxation part 13 is formed at the connecting area 15 exposing the outer peripheral end part of the internal electrode part 120, and at the outer peripheral area except for the connecting area 15.

In each of the connecting areas 15 of the ceramic laminate 10 of this Example, the stress relaxation part 13 adjacent to the non-pole part 129 of the internal electrode layer 12 is not formed.

All of the internal electrode layers 12 of the ceramic laminate 10 of this Example are sealed almost completely by ceramic material at the connecting areas 15 nearby places where the non-pole parts are formed.

Therefore, according to the ceramic laminate 10 of this Example, the electric insulation at the connecting areas 15 can be ensured at high level, and the electric reliability of the laminate-type piezoelectric element 1 can be improved.

Figure 18:
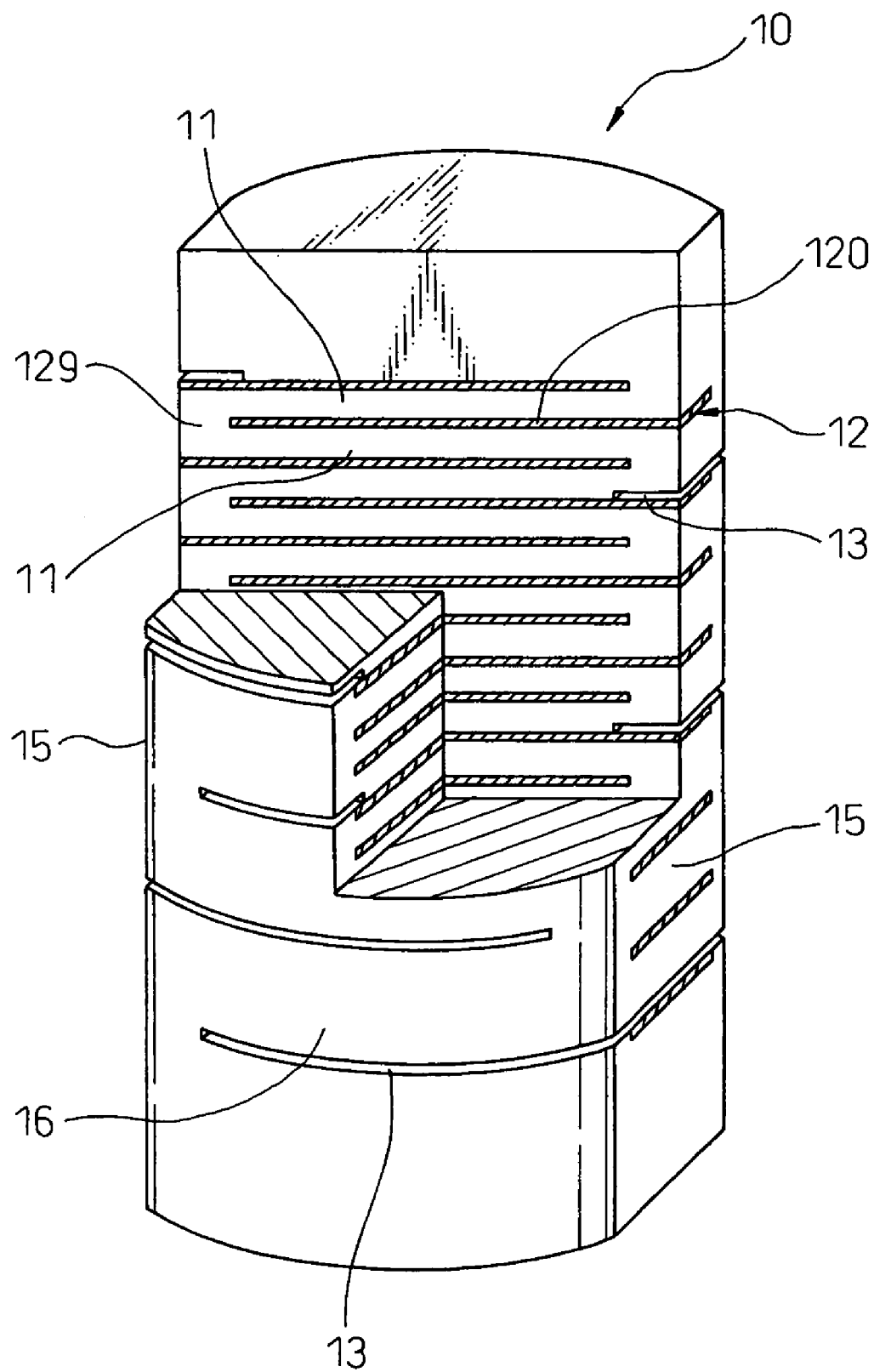
FIG. 18 is a sectional drawing to illustrate a stacked structure of an alternative ceramic laminate in Example 2.

Others on a construction and an effect of this Example are the same as in Example 1. In this Example, locations of the stress relaxation parts 13 in the stacking direction of the ceramic laminate 10 are along every other internal electrode layer 12. In place of this, in the same way as Example 1, the intervals of these locations can be modified. For example, as shown in FIG. 18, the stress relaxation parts 13 can be placed also along every two internal electrode layers 12, i.e. along one internal electrode layer 12 of every three internal electrode layers 12.

Figure 19:
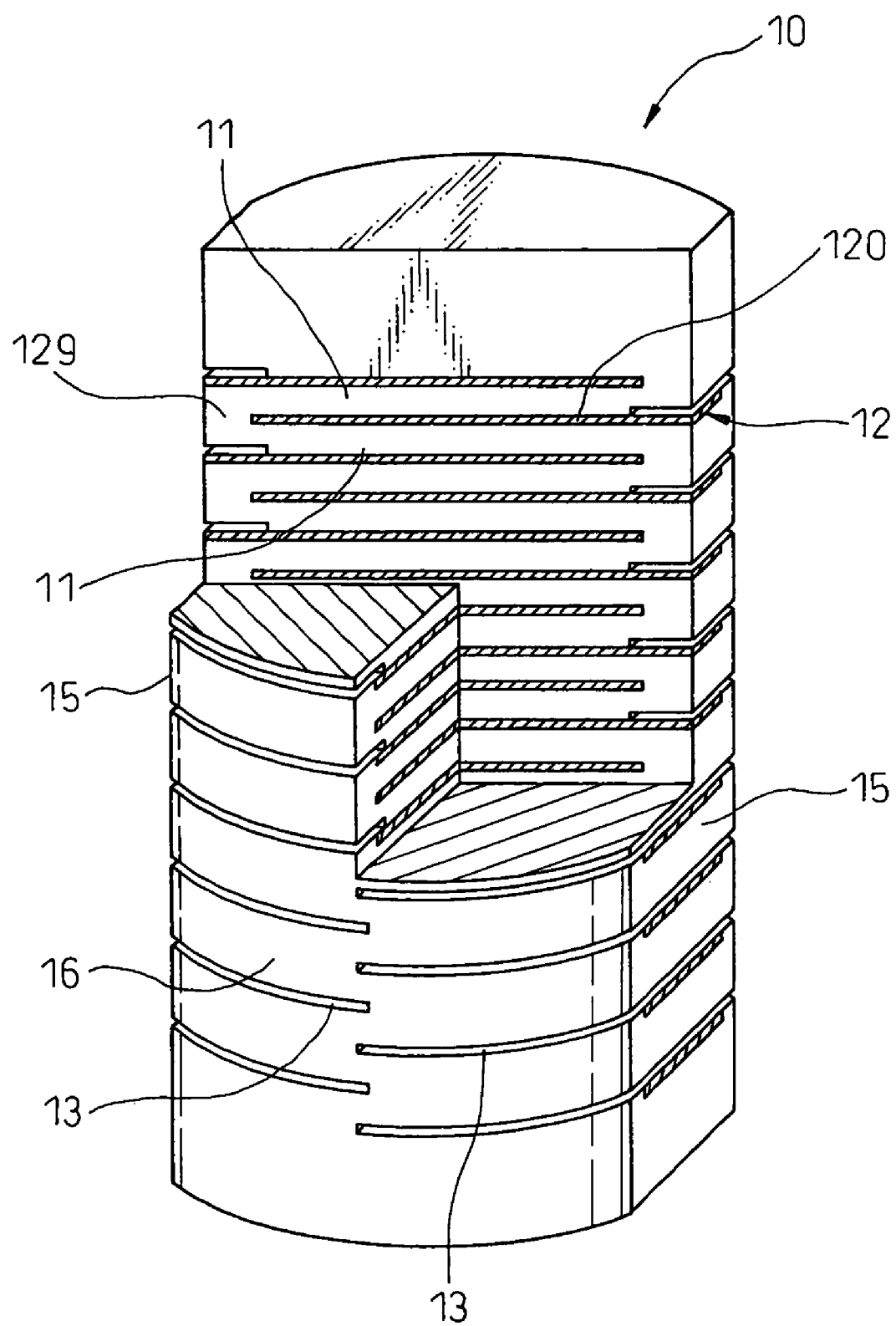
FIG. 19 is a sectional drawing to illustrate a stacked structure of an alternative ceramic laminate in Example 2.

Further, as shown in FIG. 19, it also is effective that the stress relaxation parts 13 are formed along the internal electrode layers 12 stacked side by side so as not to overlap in the stacking direction, as well as forming the stress relaxation parts 13 along all of the internal electrode layers 12.

In other words, the stress relaxation parts 13 of FIG. 19 show a shape close to a semicircle at a sectional area approximately orthogonal to the stacking direction.

Therefore, in the outer peripheral area of the ceramic laminate 10 of this Example, each of the stress relaxation parts 13 along the internal electrode layers 12 stacked side by side is not opening side by side in the stacking direction.

When the stress relaxation parts 13 are formed as described above, even if the stress relaxation parts 13 are formed along all of the internal electrode layers 12, the electric insulation can become to be easily ensured at the outer peripheral area of the ceramic laminate 10.

Example 3

This Example is an example where the stress relaxation parts of the ceramic laminate in Example 1 or Example 2 are formed with a porous ceramic material. The content of this Example is explained below, by using FIG. 20 and FIG. 21.

Figure 20:
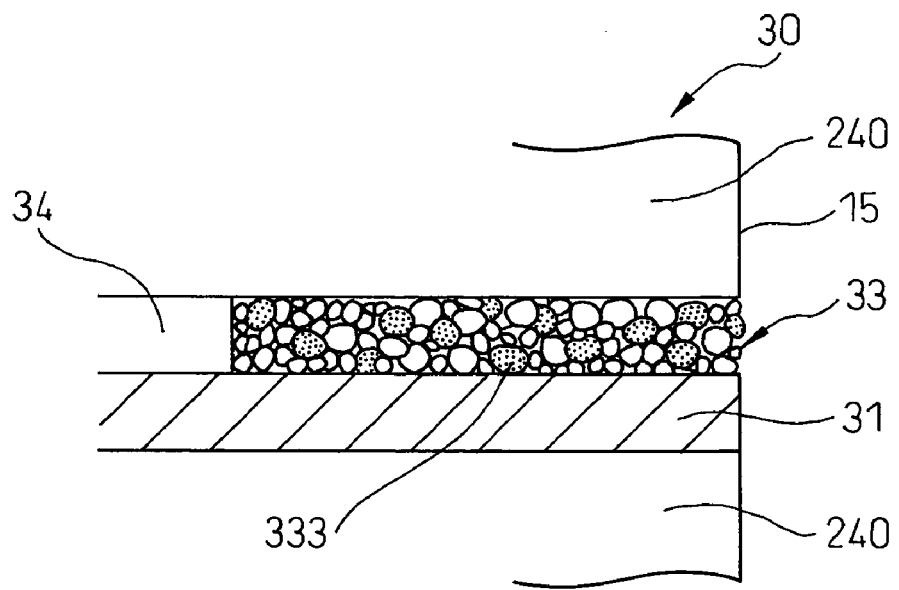
FIG. 20 is a magnified sectional drawing to illustrate a structure around a part, where a stress relaxation material is placed, in an intermediate laminate of Example 3.

In this Example, as shown in FIG. 20, the stress relaxation material 33 is used, which was formed by dispersing carbon particles 333 as the vanishing material in the slurry composed of the ceramic material in Example 1, in place of the stress relaxation material consisting of only the vanishing material.

Figure 21:
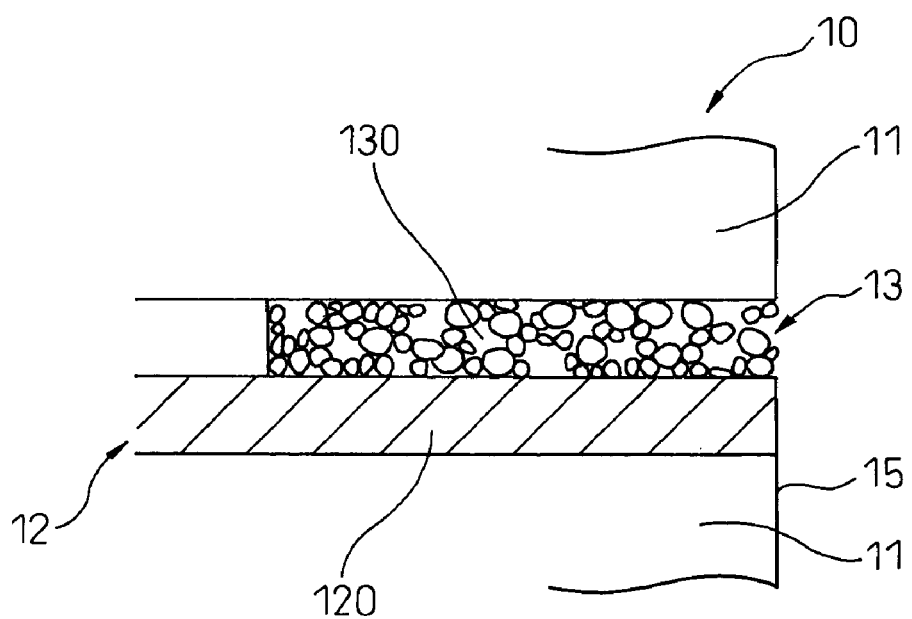
FIG. 21 is a magnified sectional drawing to illustrate a structure of a stress relaxation part in a ceramic laminate of Example 3.

FIG. 20 shows a magnified sectional structure around a part, where the stress relaxation material 33 is placed, in the intermediate laminate 30, and FIG. 21 shows a magnified sectional structure around the stress relaxation part 13 in the ceramic laminate 10.

In this Example, as shown in FIG. 20, carbon particles 333 with an average particle diameter of 3 μm, corresponding to about 6 times of an average particle diameter of piezo particles forming a slurry, were used as said vanishing material. The slurry and the vanishing material were mixed so that the vanishing material of about 25 volume % is contained in contrast to the stress relaxation material of 100 volume %.

In the ceramic laminate 10 where the intermediate laminate 30, placed this stress relaxation material 33, was vanished, as shown in FIG. 21, the stress relaxation part 13 in shape of a silt is prepared, which was formed with porous ceramic material containing a plurality of pores 130 formed by vanishing carbon particles 333. When the stress relaxation part 13 is formed with the porous ceramic material, stiffness of the stress relaxation part 13 can be decreased, in comparison with the ceramic material 11 composed of dense ceramic material.

Further, when the porous ceramic material is used, the shape of a part to construct the stress relaxation part 13 can be maintained with high accuracy during calcining, and the accuracy of the shape of the calcined ceramic laminate 10 can be improved. In the ceramic laminate 10 after calcining, said stress relaxation part 13 becomes a part showing suitable flexibility based on its porous structure.

For that reason, the ceramic laminate 10 in this Example has a good shape accuracy, and becomes one which can restrain the stresses acting on the non-pole parts 129 (see FIG. 1), and the laminate-type piezoelectric element 1 formed with this ceramic laminate 10 can obtain excellent properties.

Other structures and effects of this Example are the same as Example 1 or Example 2.

Herein, the average particle diameter of particles such as carbon particles and the like forming said vanishing material is preferably 2 times or more and 20 times or less of the average particle diameter of piezo particles.

By adjusting the average particle diameter of particles composing said vanishing material in said range, suitably large pores can be formed in the ceramic material, and both of the shape accuracy and the strength of the formed stress relaxation parts 13 can be achieved.

Further, the volume ratio of the vanishing material to the stress relaxation material of 100 volume % is preferably 10 volume % or more and 40 volume % or less.

By adjusting the volume ratio of the vanishing material in said range, both of the shape accuracy and the strength of the formed stress relaxation parts 13 can be obtained.

In particular, by adjusting the volume ratio of the vanishing material in the stress relaxation material 33 of 100 volume % in a range of 10 volume % or more and 40 volume % or less, the stress relaxation parts 13 can be formed with high shape accuracy. By adjusting the volume ratio of the vanishing material in the stress relaxation material 33 of 100 volume % in a range of 10 volume % or more and 30 volume % or less, the strength of the stress relaxation part 13 can be ensured in a certain extent.

What is claimed is:

1. A laminate-type piezoelectric element comprising a ceramic laminate with ceramic layers and internal electrode layers respectively stacked alternately, and a pair of external electrodes respectively connecting with a pair of connecting areas formed at an outer peripheral area of the ceramic laminate, wherein each of said internal electrode layers comprises an internal electrode part with electric conductivity, and a non-pole part where the internal electrode part does not exist at the inside near an outer peripheral area of said ceramic laminate, said ceramic laminate comprises stress relaxation parts, wherein each of the stress relaxation parts, being able to modify more easily its own shape than said ceramic layer, is adjacent to at least a part of said internal electrode layer in a direction of stacking said ceramic layers, each of said stress relaxation parts is located to overlap with said non-pole parts of either of said internal electrode layers in the stacking direction.

2. The laminate-type piezoelectric element of claim 1, wherein said every other internal electrode layer, exposing said internal electrode part at one side of said connecting areas, comprises said non-pole part at the other side of the connecting areas, and said every other internal electrode layer, exposing said internal electrode part at the other side of said connecting areas, comprises said non-pole part at the one side of the connecting areas.

3. The laminate-type piezoelectric element of claim 2, wherein each of said stress relaxation parts is formed, at a place adjacent to said internal electrode part in the stacking direction, by avoiding a place adjacent to the non-pole part in the stacking direction, at each of said connecting areas.

4. The laminate-type piezoelectric element of claim 2, wherein each of said stress relaxation parts is formed by facing both of said connecting areas along said internal electrode layer adjacent to the stress relaxation part in the stacking direction.

5. The laminate-type piezoelectric element of claim 1, wherein each of said non-pole parts of the internal electrode layers is formed over the entire range in a peripheral direction of an outer insulation peripheral area, i.e. an outer peripheral area except for each of said connecting areas of the outer peripheral areas of said ceramic laminate, and each of said stress relaxation parts is formed over the entire range in the peripheral direction of the outer insulation peripheral area.

6. The laminate-type piezoelectric element of claim 1, wherein each of said stress relaxation parts is formed adjacent in the stacking direction to all of said internal electrode layers or to every one or more and 12 or less internal electrode layers in the stacking direction.

7. The laminate-type piezoelectric element of claim 1, wherein each of said stress relaxation parts is a gap in the shape of a slit.

8. The laminate-type piezoelectric element of claim 1, wherein each of said stress relaxation parts is a part in the shape of a thin layer composed of porous ceramic material.

9. The laminate-type piezoelectric element of claim 1, wherein each of said stress relaxation parts is a part where insulating material with electrical insulation properties is filled in the gap in the shape of a slit.

10. The laminate-type piezoelectric element of claim 1, wherein the thickness of said stress relaxation part in the stacking direction is 1 µm or more and 18 µm or less.

* * * * *